United States Patent
Perreault

(10) Patent No.: US 9,634,577 B2
(45) Date of Patent: Apr. 25, 2017

(54) INVERTER/POWER AMPLIFIER WITH CAPACITIVE ENERGY TRANSFER AND RELATED TECHNIQUES

(71) Applicant: MASSACHUSETTS INSTITUTE OF TECHNOLOGY, Cambridge, MA (US)

(72) Inventor: David J. Perreault, Andover, MA (US)

(73) Assignee: Massachusetts Institute of Technology, Cambridge, MA (US)

(*) Notice: Subject to any disclaimer, the term of this patent is extended or adjusted under 35 U.S.C. 154(b) by 0 days.

(21) Appl. No.: 14/401,981

(22) PCT Filed: Mar. 13, 2013

(86) PCT No.: PCT/US2013/030763
§ 371 (c)(1),
(2) Date: Nov. 18, 2014

(87) PCT Pub. No.: WO2013/191757
PCT Pub. Date: Dec. 27, 2013

(65) Prior Publication Data
US 2015/0171768 A1    Jun. 18, 2015

Related U.S. Application Data

(60) Provisional application No. 61/661,068, filed on Jun. 18, 2012.

(51) Int. Cl.
| | | |
|---|---|---|
| H03F 3/68 | (2006.01) |
| H02M 7/537 | (2006.01) |
| H03F 3/217 | (2006.01) |
| H03F 1/02 | (2006.01) |
| H03F 1/32 | (2006.01) |

(Continued)

(52) U.S. Cl.
CPC ............ *H02M 7/537* (2013.01); *H03F 1/025* (2013.01); *H03F 1/0227* (2013.01); *H03F 1/3282* (2013.01); *H03F 3/2171* (2013.01); *H03F 3/245* (2013.01); *H03F 3/602* (2013.01); *H03F 3/211* (2013.01); *H03F 3/68* (2013.01); *H03F 2200/204* (2013.01); *H03F 2200/345* (2013.01); *H03F 2200/348* (2013.01);

(Continued)

(58) Field of Classification Search
CPC ........ H03F 1/0205; H03F 1/083; H03F 1/086; H03F 2200/102; H03F 2200/451; H03F 3/19; H03F 3/21; H03F 3/505
USPC ........................................ 330/127, 136, 297
See application file for complete search history.

(56) References Cited

U.S. PATENT DOCUMENTS

| | | | | |
|---|---|---|---|---|
| 5,442,317 A | * | 8/1995 | Stengel ................. | H02M 3/158 330/10 |
| 6,373,340 B1 | * | 4/2002 | Shashoua .............. | H03F 1/0244 330/297 |

(Continued)

FOREIGN PATENT DOCUMENTS

WO    WO 2012/151466 A2    11/2012

OTHER PUBLICATIONS

U.S. Appl. No. 14/968,045, filed Dec. 14, 2015, Perreault et al.
(Continued)

*Primary Examiner* — Khanh V Nguyen
(74) *Attorney, Agent, or Firm* — Daly, Crowley, Mofford & Durkee, LLP

(57) ABSTRACT

Circuit topologies and control methods for a dc-to-rf converter circuit are described.

18 Claims, 20 Drawing Sheets

(51) Int. Cl.
*H03F 3/24* (2006.01)
*H03F 3/60* (2006.01)
*H03F 3/21* (2006.01)

(52) U.S. Cl.
CPC .. *H03F 2200/351* (2013.01); *H03F 2200/511* (2013.01); *H03F 2201/3209* (2013.01); *Y10T 307/461* (2015.04)

(56) References Cited

U.S. PATENT DOCUMENTS

| | | | |
|---|---|---|---|
| 7,403,400 B2* | 7/2008 | Stanley | G05F 1/70 323/225 |
| 7,482,869 B2 | 1/2009 | Wilson | |
| 7,535,133 B2 | 5/2009 | Perreault et al. | |
| 7,589,605 B2 | 9/2009 | Perreault et al. | |
| 7,663,429 B2* | 2/2010 | Wang | H03F 3/21 327/536 |
| 7,760,026 B2 | 7/2010 | Young et al. | |
| 7,889,519 B2 | 2/2011 | Perreault et al. | |
| 7,956,572 B2 | 6/2011 | Zane et al. | |
| 8,026,763 B2 | 9/2011 | Dawson et al. | |
| 8,193,864 B2* | 6/2012 | Model | H02J 1/08 323/268 |
| 8,212,541 B2 | 7/2012 | Perreault et al. | |
| 8,451,053 B2 | 5/2013 | Perreault et al. | |
| 8,718,188 B2 | 5/2014 | Balteanu et al. | |
| 8,824,978 B2 | 9/2014 | Briffa et al. | |
| 8,829,993 B2 | 9/2014 | Briffa et al. | |
| 8,830,710 B2 | 9/2014 | Perreault et al. | |
| 2003/0227330 A1 | 12/2003 | Khanifar et al. | |
| 2005/0286278 A1 | 12/2005 | Perreault et al. | |
| 2006/0071924 A1 | 4/2006 | Svensson et al. | |
| 2008/0019459 A1 | 1/2008 | Chen et al. | |
| 2008/0044041 A1* | 2/2008 | Tucker et al. | H02M 3/07 381/120 |
| 2009/0256632 A1 | 10/2009 | Klingberg et al. | |
| 2009/0278520 A1* | 11/2009 | Perreault et al. | H02M 3/07 323/282 |
| 2009/0322304 A1 | 12/2009 | Oraw et al. | |
| 2010/0073084 A1 | 3/2010 | Hur et al. | |
| 2010/0117727 A1* | 5/2010 | Dawson | H03F 1/0244 330/124 R |
| 2010/0264991 A1 | 10/2010 | Young et al. | |
| 2013/0241625 A1 | 9/2013 | Perreault et al. | |
| 2014/0120854 A1 | 5/2014 | Briffa et al. | |
| 2014/0167513 A1 | 6/2014 | Chang et al. | |
| 2014/0313781 A1 | 10/2014 | Perreault et al. | |
| 2014/0339918 A1 | 11/2014 | Perreault et al. | |
| 2014/0355322 A1 | 12/2014 | Perreault et al. | |
| 2015/0023063 A1 | 1/2015 | Perreault et al. | |
| 2015/0084701 A1 | 3/2015 | Perreault et al. | |

OTHER PUBLICATIONS

U.S. Appl. No. 14/974,563, filed Dec. 18, 2015, Perreault et al.
U.S. Appl. No. 14/975,742, filed Dec. 19, 2015, Perreault et al.
International Preliminary Report on Patentability for Application No. PCT/US2013/030763 dated Dec. 31, 2014.
U.S. Appl. No. 14/416,654, filed Jan. 23, 2015, Perreault, et al.
U.S. Appl. No. 14/416,737, filed Feb. 11, 2015, Perreault, et al.
U.S. Appl. No. 14/435,914, filed Apr. 15, 2015, Perreault, et al.
U.S. Appl. No. 14/758,033, filed Jun. 26, 2015, Perreault, et al.
U.S. Appl. No. 14/791,685, filed Jul. 6, 2015, Perreault, et al.
U.S. Appl. No. 14/837,616, filed Aug. 27, 2015, Briffa, et al.
U.S. Appl. No. 14/823,220, filed Aug. 11, 2015, Barton, et al.
Ertl, et al.; "Analysis of a Multilevel Multicell Switch-Mode Power Amplifier Employing the "Flying-Battery" Concept;" IEEE Transactions on Industrial Electronics; vol. 49; No. 4; Aug. 2002; pp. 816-823.
Vasic, et al.; "Envelope Amplifier Based on Switching Capacitors for High Efficiency RF Amplifiers;" Power Electronics; IEEE Transactions; vol. 26; No. 3; Aug. 4, 2011; 10 pages.
PCT Search Report of the ISA for PCT/US2013/030763 dated May 28, 2013; 4 pages.
PCT Written Opinion of the ISA for PCT/US2013/030763 dated May 28, 2013; 12 pages.
U.S. Appl. No. 14/934,760, filed Nov. 6, 2015, Briffa, et al.
U.S. Appl. No. 14/920,031, filed Oct. 22, 2015, Briffa, et al.
U.S. Appl. No. 15/149,491, filed May 9, 2016, Perreault, et al.
U.S. Appl. No. 15/290,402, filed Oct. 11, 2016, Perreault, et al.
U.S. Appl. No. 15/287,068, filed Oct. 6, 2016, Briffa, et al.
U.S. Appl. No. 15/354,170, filed Nov. 17, 2016, Briffa, et al.

* cited by examiner

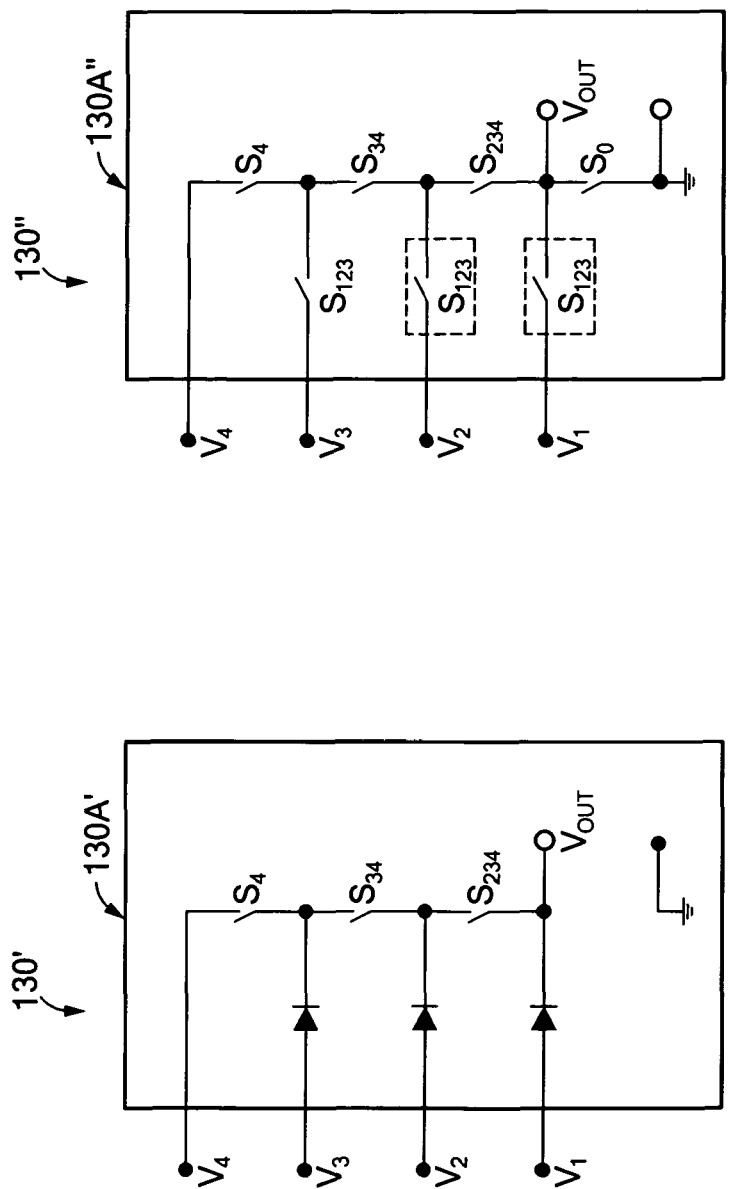

INVERTER/POWER AMPLIFIER WITH CAPACITIVE ENERGY TRANSFER AND RELATED TECHNIQUES

CROSS REFERENCE TO RELATED APPLICATIONS

This application is a U.S. National Stage of PCT application PCT/US2013/030763 filed in the English language on Mar. 13, 2013, and entitled "INVERTER/POWER AMPLIFIER WITH CAPACITIVE ENERGY TRANSFER AND RELATED TECHNIQUES," which claims the benefit of provisional application No. 61/661,068 filed Jun. 18, 2012, which application is hereby incorporated herein by reference.

STATEMENT REGARDING FEDERALLY SPONSORED RESEARCH

Not Applicable.

FIELD OF THE INVENTION

The concepts described herein relate to inverter/power amplifier systems, and more particularly to inverter/power amplifier systems with capacitive energy transfer.

BACKGROUND OF THE INVENTION

As is known in the art, there is a need for radio-frequency (RF) power amplifiers and inverters that can provide high efficiency across a wide range of output powers. In some cases, it may be desirable to simply be able to generate ac output power efficiently at multiple different output power levels or to maintain a narrow range of ac output amplitude as the dc input varies over a wide range. Such approaches may be taken, for example, in applications relating to some kinds of RF transmitters, as well as inverters for dc-dc converters.

In other cases, it may be desirable to achieve high efficiency as output power is varied continuously over a wide range, while at the same time meeting strict linearity and dynamic requirements. Applications falling into this category include audio power amplifiers and RF power amplifiers for magnetic resonance imaging (MRI) and for RF communications, including cell phone base stations and handsets.

One approach for building an inverter or power amplifier system that maintains high efficiency over a wide output power range is to provide a means for the inverter or power amplifier supply voltage to be switched among multiple discrete voltage levels. In this approach, lower voltage levels are provided to the power amplifier when low output power is desired, and higher voltage levels are provided to the power amplifier when high output power is needed. Instantaneous output power can be controlled to finer resolution by a secondary means of control, such as using a linear regulator or other added converter to further control bias voltage. Such techniques are taught, for example, in: U.S. Pat. No. 7,482,869, issued Jan. 27, 2009 entitled "High Efficiency Amplification;" as well as in F. H. Raab, "Average Efficiency of Class-G Power Amplifiers," *IEEE Transactions on Consumer Electronics*, Vol. CE-32, no. 2, pp. 145-150, May 1986; and J. S. Walling, S. S. Taylor, and D. J. Allstot, "A Class-G Supply Modulator and Class-E PA in 130 nm CMOS," *IEEE Journal of Solid-State Circuits*, Vol. 44, No. 9, pp. 2339-2347, September 2009 (which describes a version of the so-called "Class G" technique).

The approach of switching among multiple discrete voltage levels may also be implemented by providing delta sigma modulation or other discrete modulation among the power supply levels, providing pulse-width modulation, pulse density modulation, frequency modulation, drive amplitude modulation of the power amplifier, or phase-shift control or outphasing of two or more power amplifiers. Systems of this latter type include multilevel LINC (MLINC) Power Amplifiers Y.-J. Chen, K.-Y. Jheng, A.-Y. Wu, H.-W. Tsao, and P. Tseng, "Multilevel LINC Transmitter," U.S. Patent Application Publication 2008/0019459 A1, Jan. 24, 2008 and J. Hur, K.-W. Kim, K. Lim, C.-H. Lee, H. Kim, and J. Laskar, "Systems and Methods for a Level-Shifting High-Efficiency LINC Amplifier using Dynamic Power Supply," U.S. Patent Application Publication 2010/10073084 A1, Mar. 25, 2010 and Asymmetric Multilevel Outphasing (AMO) Power Amplifiers J. L. Dawson, D. J. Perreault, S. Chung, P. Godoy, and E. Huang, "Asymmetric Multilevel Outphasing Architecture for RF Amplifiers," U.S. Patent Application Publication, US 2010/10117727 A1, May 13, 2010 (which application is assigned to the assignee of the present invention).

In these systems, it is desirable to synthesize the multiple levels used by the inverters/power amplifier(s) or used by the voltage regulation circuitry that provides the continuously variable supply voltage to the power amplifier(s) as efficiently and compactly as possible. One approach for doing so is to synthesize multiple static dc levels simultaneously, and switch among them by a switching network connected between the dc outputs and the power amplifier or between the dc outputs and further regulation circuitry. This generation of multiple levels can be accomplished using a multiple output magnetic dc-dc converter (such as a multi-output flyback converter) operated from a single supply, or through the use of a plurality of dc-dc converters, as Illustrated in M. Vasic, O. Garcia, J. A. Oliver, P. Alou, D. Diaz, J. A. Cobos, "Comparison of Two Multilevel Architectures for Envelope Amplifier", 2009 Industrial Electronics Conference, pp. 283-289, Nov. 3-5, 2009.

SUMMARY OF THE INVENTION

In accordance with the concepts, circuits, systems and techniques described herein, one may simultaneously generate multiple levels with a multilevel switched-capacitor power converter, and utilize a switching network to select which level is provided to the output. An example means of implementing this approach is illustrated in the aforementioned U.S. Patent Application Publication US 2010/10117727 A1, which application is assigned to the assignee of the present invention. This approach provides a set of voltages that can have tightly controlled values, and enables simple networks to do the level switching.

A further means of realizing a system is to implement a switched-capacitor power converter whose conversion ratio or set of conversion ratios can be changed through at least one of a set of configuration switches (which may be placed at the input and/or the output of the switched-capacitor converter system or elsewhere) or through changing the operating pattern(s) of the converter switches. The output may be switched among different levels by changing these configuration switches and/or by changing the operating pattern(s) of the converter switches.

One can also realize a switched-capacitor voltage modulator that does not simultaneously and continuously generate multiple internal levels from which an output is selected, but rather dynamically synthesizes a desired level through adjustment of its (e.g., cyclical) switching and charge transfer pattern.

It has been recognized that a possible approach is a two-stage or merged-two-stage conversion system. Two-stage and merged two-stage conversion in the context of switching power converters is illustrated in D. J. Perreault, R. C. N. Pilawa-Podgurski, and D. M. Giuliano, "Power Converter with Capacitive Energy Transfer and Fast Dynamic Response," U.S. Patent Application Publication 2009/0278520 A1, Nov. 12, 2009, which application is assigned to the assignee of the present invention. In this approach, a first power conversion stage—a reconfigurable switched-capacitor power converter—is implemented such that it can provide power conversion at multiple distinct conversion ratios to provide an Intermediate voltage that takes on one of a multiplicity of values depending upon which conversion ratio is selected at a given time. Either "conventional" or "resonant" switched-capacitor circuits can be used. Moreover, a low-dropout linear regulator or other filtering element can be provided at the output of the switched-capacitor circuit to provide smoother waveforms during the transition. This intermediate voltage is coupled to the input of a second power conversion stage (e.g., the power supply Input of an RF power amplifier or set of outphasing switching RF amplifiers), which delivers power to an output. The RF power amplifier or set of outphasing PAs comprising the second stage can optionally be used to further modulate the output amplitude to a precise level.

By recognizing that one can relax the requirement/assumption that the switched-capacitor system operate in at least two phases and be able to continuously deliver energy at a given conversion ratio can if energy need only be delivered to the intermediate voltage port (first-stage output second-stage input) at one or more of the voltage levels for a limited duration of time, it has been found that conversion circuits for the first stage of a two-stage dc-rf conversion system (either a merged or a separate two-stage dc-rf conversion system) can have fewer required components and/or smaller component size because they needn't operate continuously at each voltage level. Thus, this approach saves valuable space either for a discrete board-level implementation or on an integrated circuit (IC), which in turn reduces the cost of the IC.

This is reasonable in many applications. For example, in practice, power amplifiers (PAas) for magnetic resonance imaging (MRI) systems only deliver peak power for very short durations to time and hence the voltage level at the PA input only needs to be held at the highest level for short durations. Likewise, modern communications codes such as orthogonal frequency division multiplexing (OFDM) yield signals to be transmitted such that only short contiguous durations of high output power (and hence high PA input voltage) are required. Based upon this, it has further been recognized in accordance with the concepts, circuits, systems and techniques described herein that conversion circuits for the first stage of a (merged or separate) two-stage dc-rf conversion system can have fewer required components and/or smaller component size because they needn't operate continuously at each voltage level. These circuits, which mainly comprise capacitors and switches, are a super-set of conventional switched capacitor circuits (which can operate continuously at each conversion level). This class of circuits is termed "capacitor voltage modulator circuits", to reflect the fact that they are a larger class of circuits than conventional switched-capacitor converter circuits.

Because energy needn't be delivered indefinitely at each voltage level, high performance can be achieved with simpler capacitor voltage modulator circuits than would be necessary if the circuit need deliver energy continuously at each voltage level (i.e., using switched-capacitor converter methods).

BRIEF DESCRIPTION OF THE DRAWINGS

The foregoing features of the concepts, systems, circuits and techniques described herein may be more fully understood from the following description of the drawings in which:

FIG. 1A is a circuit diagram of an embodiment of a switch network as may be used in the AMO circuit of FIG. 1;

FIG. 1B is a circuit diagram of another embodiment of a switch network as may be used in the AMO circuit of FIG. 1;

DETAILED DESCRIPTION OF THE PREFERRED EMBODIMENTS

Figure 1:
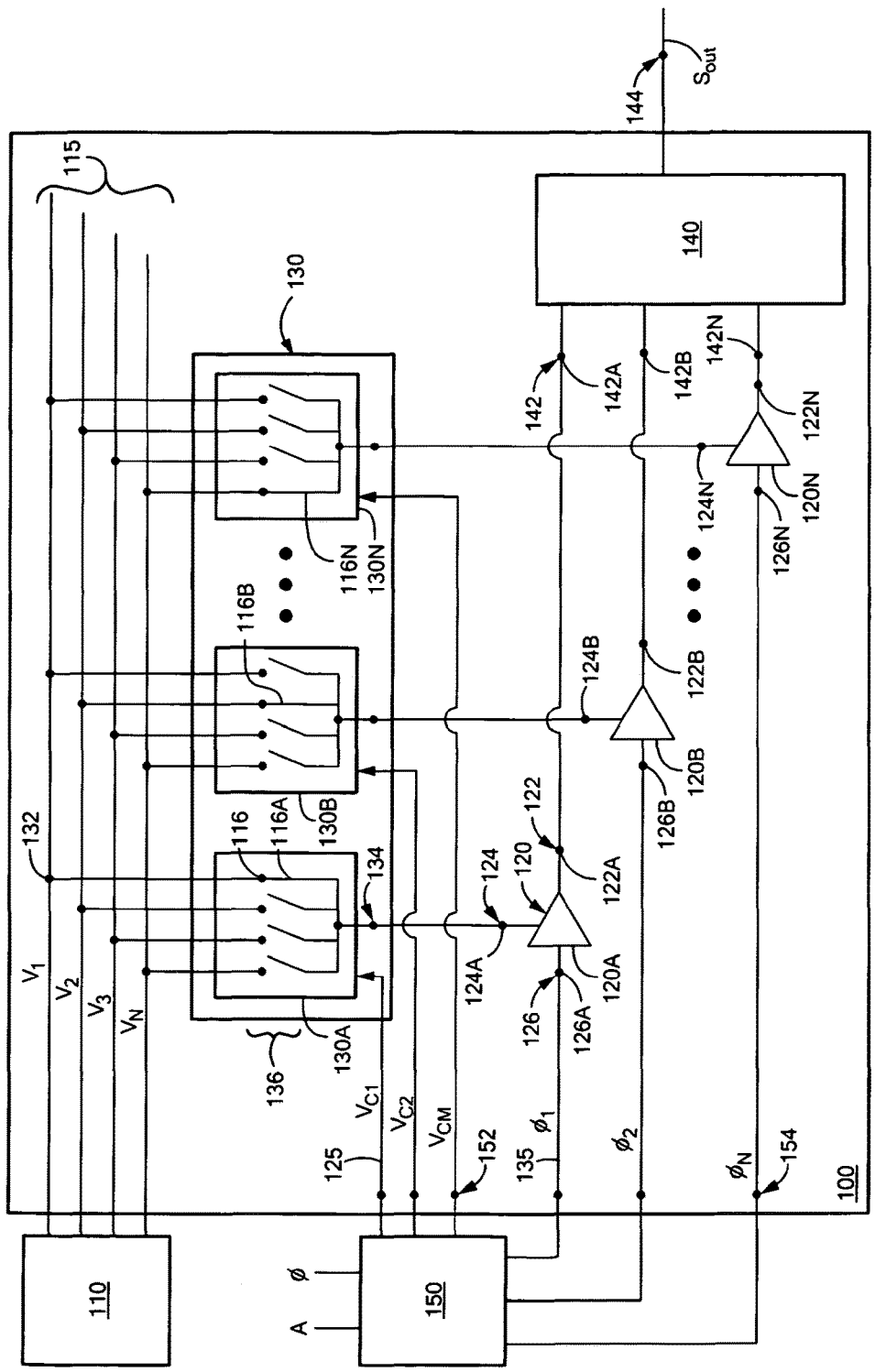
FIG. 1 is a block diagram of an embodiment of an asymmetric multilevel outphasing (AMO) circuit.

Before describing several exemplary embodiments of dc-to-rf converter circuits (i.e. a circuit which receives DC power from a source and inverts it to AC power) and processing performed by and on such circuits, some introductory concepts are explained. It should be noted that the term "inverter" is widely used in the switched-mode power electronics field to refer to a dc-to-ac power converter—i.e. a system using devices operated as switches to convert a dc input to an ac output. The term "power amplifier" is more widely used in the audio and radio-frequency (RF) electronics fields, and depending upon the class of power amplifier, may refer to synthesizing an output using devices as switches, in linear mode (e.g., as current sources) or as a combination of these. The techniques described herein are applicable to any of these designs (i.e. circuit designs in the switched-mode power electronics field as well as circuit designs in the audio and RF electronics fields).

It should also be appreciated that, in an effort to promote clarity in explaining the concepts, reference is sometimes made herein to specific switched capacitor circuits or specific switched capacitor circuit topologies. It should be understood that such references are merely exemplary and should not be construed as limiting. After reading the description provided herein, one of ordinary skill in the art will understand how to apply the concepts described herein to provide specific switched capacitor (SC) circuits or specific switched capacitor circuit topologies, including switched-capacitor voltage modulators which may not be capable of providing particular conversion levels indefinitely. For example, while series-parallel SC topologies may be disclosed herein, such disclosure is provided to promote clarity in the description of the general concepts described herein. After reading the disclosure provided herein those of ordinary skill in the art will appreciate that a series-parallel SC topology is only one of many possible topologies. It should thus be understood that although specific switched capacitor circuits or specific switched capacitor circuit topologies are not specifically disclosed herein, such circuits still fall within the scope of the concepts claimed herein.

It should be appreciated that reference is also sometimes made herein to particular input, output and/or intermediate voltages and/or voltage ranges as well as to particular transformation values and or ranges of transformation values. It should be understood that such references are merely exemplary and should not be construed as limiting.

Reference is also sometimes made herein to particular applications. Such references are intended merely as exemplary should not be taken as limiting the concepts described herein to that particular application.

Reference is also sometimes made herein to circuits having switches or capacitors. It should be appreciated that any switching elements or storage elements having appropriate electrical characteristics (e.g. appropriate switching or storage characteristics) may, of course, also be used.

Thus, although the description provided herein below explains the inventive concepts in the context of a particular circuit or a particular application or a particular voltage or voltage range, those of ordinary skill in the art will appreciate that the concepts equally apply to other circuits or applications or voltages or voltage ranges.

Referring now to FIG. 1, in one aspect a radio frequency (RF) circuit 100 includes a power supply 110 configured to generate a plurality of voltages $V_1$, $V_2$, $V_3$-$V_N$ (generally designated by reference numeral 115), a plurality of power amplifiers 120A, 120B-120N (generally designated by reference numeral 120), each having an RF output port 122A, 122B-122N (generally designated by reference numeral 122) and a power supply input port 124A, 124B-124N (generally designated by reference numeral 124). The RF circuit 100 includes a switch network 130 having a plurality of input ports (generally designated by reference numeral 132) coupled to the power supply 110 and a plurality of switch network output ports (generally designated by reference numeral 134) coupled to the power supply input ports 124 of the plurality of power amplifiers 120.

In the RF circuit embodiment of FIG. 1, switch network 130 includes switch circuits 130A, 130B-130N each of which is coupled to respective power amplifiers 120A, 120B-120N. Each of the switch circuits 130A, 130B-130N includes a number of switches (generally designated by reference numeral 136) selectively coupled to respective input voltages $V_1$, $V_2$, $V_3$-$V_N$ to output selected ones of the voltages 115. For example, each of the switch circuits 130A, 130B-130N includes four switches 136 to select one of the four input voltages $V_1$, $V_2$, $V_3$-$V_N$. It should be noted that although four input voltages (and four respective switches) are shown, one of ordinary skill in the art will readily appreciate that any number of input voltages may be used, for example, two, three, five, ten, 100, 1000, etc., and switch network 130 may be provided including an appropriate number of switch network input ports and switch network output ports.

The switch network 130 (which in some embodiments may be referred to as a switching circuit) is configured to output selected ones 116A, 116B-116N (generally designated by reference numeral 116) of the plurality of voltages 115 at the plurality of switch network output ports 134. At least two (i.e., two, three, five, ten, 100, 1000, etc.) of the switch network output port voltages 134 are capable of being different ones of the plurality of voltages 115. As by way of a non-limiting example shown in the RF circuit embodiment of FIG. 1, three of the selected voltages 116A, 116B, and 116N are different voltages, namely respective input voltages $V_1$, $V_2$, and $V_N$.

It should be noted that the selected voltages 116 need not be different. For example, a single voltage (e.g., $V_1$) may be selected for output at the switch network output ports 134. In other words, even though the switch network 130 is capable of outputting different ones of the input voltages 115, the same input voltage may be selected for output at the switch network output ports 134.

The RF circuit 100 further includes an RF power combiner circuit 140 having a plurality of input ports 142A, 142B-142N (generally designated by reference numeral 142) coupled to RF output ports 122 of the plurality of power amplifiers 120, and an output port 144 at which is provided an output signal $S_{out}$ of the RF circuit 100. In a further embodiment, the RF power combiner 140 is an isolating combiner.

In another embodiment, the RF circuit 100 includes a plurality of low-pass filters coupled between the switch network 130 and the power amplifiers 120. The low-pass filters can provide pulse shaping to reduce or in some cases minimize and/or even eliminate undesirable high frequency content that may be introduced into a signal primarily caused by rapid changes in the switched supply voltages 115. In some embodiments, these low-pass filters are nominally low-order LC filters with low loss, but there are many different ways that a low-pass filter can be implemented. For example, another possibility is that the parasitic capacitances and inductances, always present in any physical circuit, provide enough filtering that an explicit low-pass filter is not required. A further possibility is that the energy storage of the RF power amplifiers 120 themselves (such as owing to the use of RF input chokes or inductors) may provide enough filtering that an explicit low-pass filter is not required.

In one or more embodiments, the RF circuit 100 may be referred to as an asymmetric multilevel outphasing (AMO) architecture for multi-standard transmitters. The AMO architecture can be generalized to include two or more power amplifiers, as may be similar to power amplifiers 120 described in conjunction with FIG. 1. When combined, such two or more power amplifiers are herein referred to as an "M-way" power amplifiers. An output of M-way power amplifiers may be described as a vector sum of M different power amplifier outputs, each of which can have two or more different supply voltages, as may be similar to input voltages 115 described in conjunction with FIG. 1. Such two or more supply voltages, when combined, are herein referred to as "N-way" supply voltages. Furthermore, each of the M power amplifiers may have an arbitrary phase.

In further embodiments, the RF circuit 100 includes a control system 150 further described herein below.

It will be appreciated by one of ordinary skill in the art that the RF circuit 100 is not limited to switch circuits 130A, 130B-130N for selecting input voltages 115. As by way of non-limiting examples, a multiplexor circuit may be used to select the input voltages 115 for output to the power amplifiers 120.

Referring now to FIG. 1A, a further embodiment of a switch network 130' includes one or more switch circuits 130A', each of which is coupled one of the power amplifiers 120 (shown in FIG. 1).

Referring now to FIG. 1B, another embodiment of a switch network 130" includes one or more switch circuits 130A", each of which is coupled to one of the power amplifiers 120. It will be understood by one of ordinary skill in the art that some embodiments of a switch network may include combinations of switch circuits (e.g., combinations of switch circuits 130A, 130A', and/or 130A").

Figure 1C:
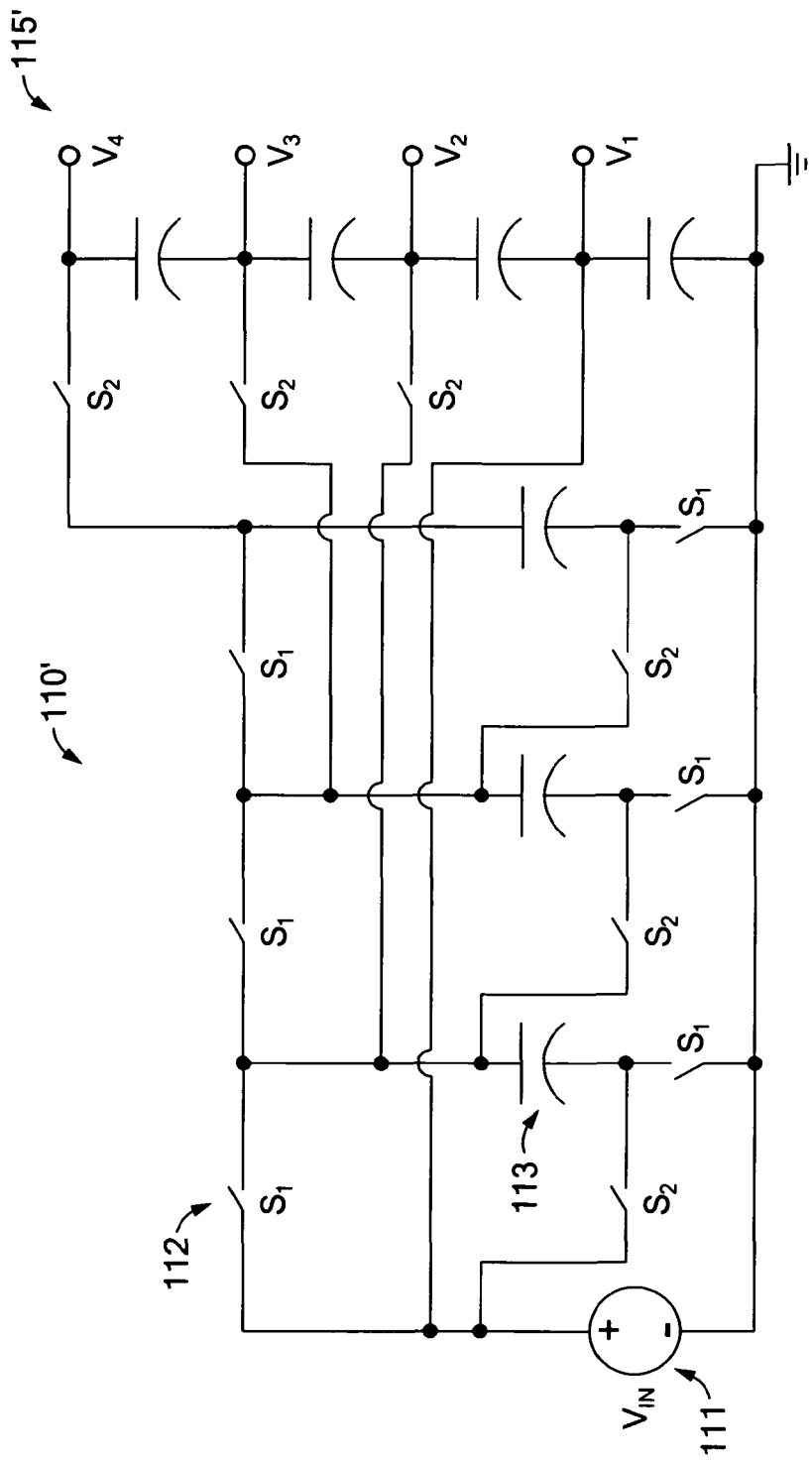
FIG. 1C is an exemplary embodiment of a power supply as may be used for supplying voltages to the AMO circuit of FIG. 1.

Referring again to FIG. 1, it should be noted that power supply 110 is not limited to any particular type of power supply and includes most any power supply capable of generating the plurality of voltages 115. Referring now to FIG. 1C, a non-limiting example of a switched-capacitor power supply 110' is shown including a voltage supply 111, switches (an example of which is designated by reference numeral 112, and switched capacitors (an example of which is designated by reference numeral 113) to provide voltages 115'. It should be noted that although four voltages are shown, the power supply 110' may generate any number of needed and/or desired voltages.

Figure 2:
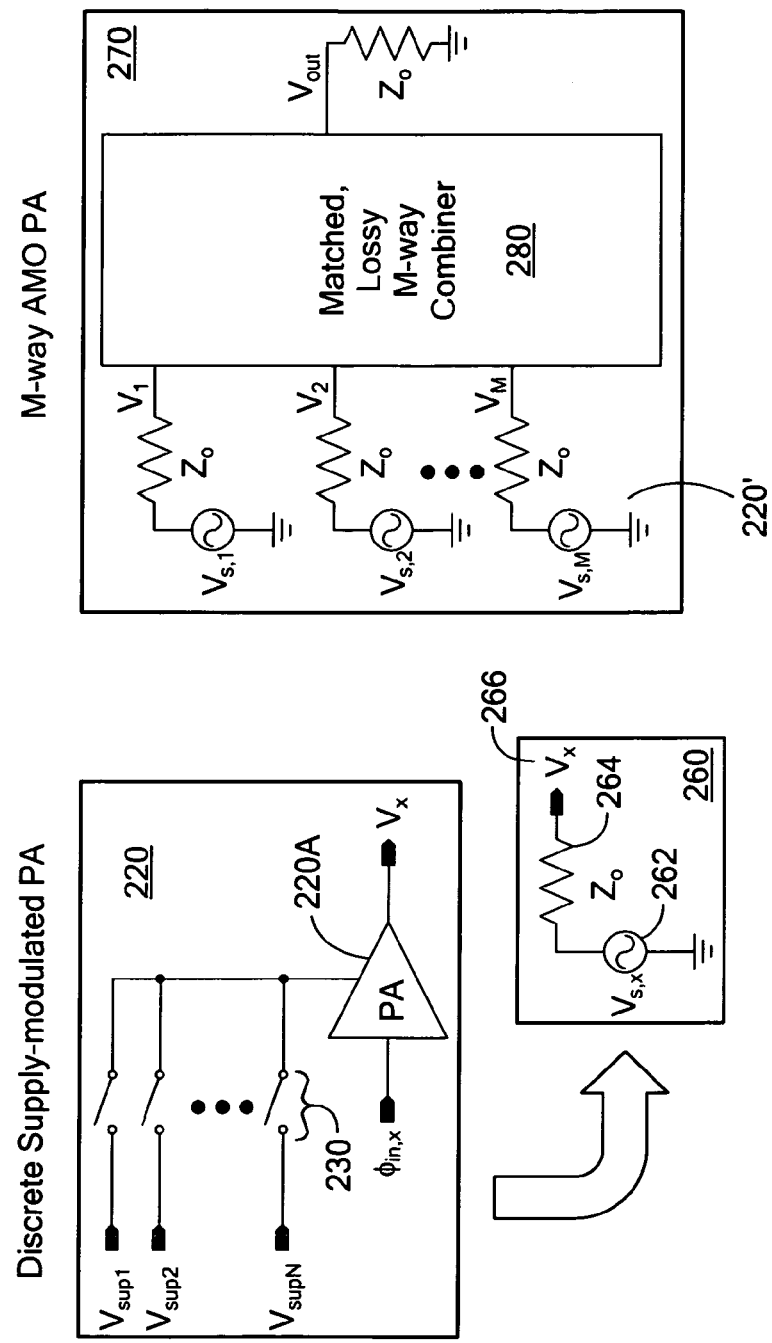
FIG. 2 is a schematic circuit diagram of an M-way power amplifier/N-way voltage level AMO circuit embodiment.

Referring now to FIG. 2, a schematic circuit diagram of a discrete supply-modulated power amplifier circuit 220 includes a power amplifier 220A coupled through switches 230 to voltage supplies $V_{sup1}$, $V_{sup2}$-$V_{supN}$. The power amplifier 220A receives an arbitrary phase signal $\phi_{in,x}$.

The discrete supply-modulated power amplifier circuit 220 may be represented as an equivalent circuit layout 260, which includes a voltage supply 262, resistor 264, and output voltage $V_x$ 266. A schematic of an M-way AMO power amplifier circuit 270 includes M circuit layouts 260 (an example of which is designated by reference numeral 220) coupled in parallel to a matched, lossy, M-way combiner 280 providing output voltage $V_{out}$.

Figure 3:
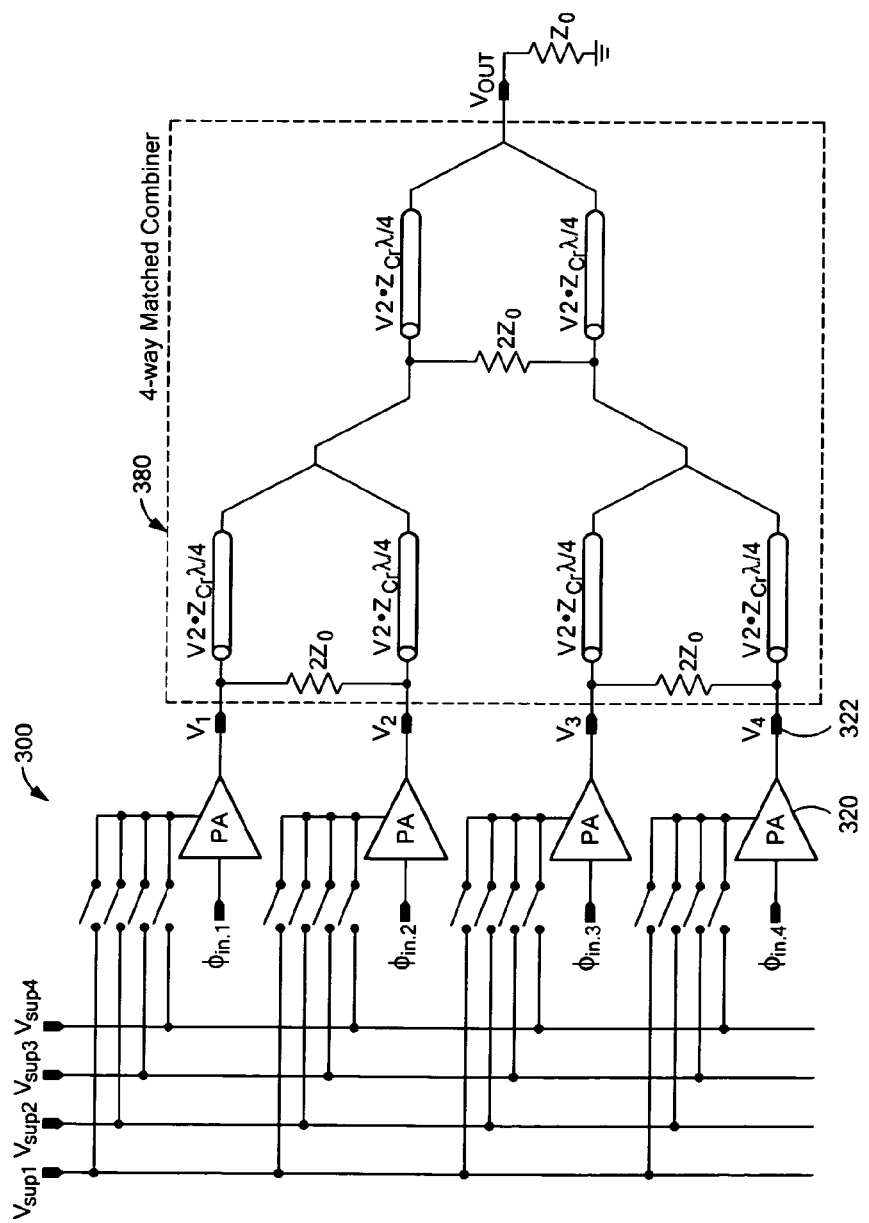
FIG. 3 is a block diagram of 4-way power amplifier/4-way voltage level AMO circuit embodiment including a 4-way matched combiner.

Referring now to FIG. 3, an example of an M-way, N-way circuit 300 is shown in which M=4 and N=4. A 4-way matched combiner 380 combines outputs 322 of each of the power amplifiers 320. The 4-way matched combiner 380 is realized as a corporate array (or binary tree) of 2-way Wilkinson combiners.

It will be appreciated by one of ordinary skill in the art that other types of combiners may be used. As by way of non-limiting examples, a combiner may include a binary or "corporate tree" of 2-way combiners, an M-way Wilkinson combiner, and/or a M-way inter-phase transformer with isolation resistors.

An M-way AMO circuit of the type described herein can be advantageous at high frequencies and power levels. For example, using two or more outphased power amplifiers in an AMO circuit can increase the number of efficiency peaks in power output performance for a given number of supply voltage levels. The efficiency for a given supply voltage combination using a matched isolating M-way combiner can be calculated as follows:

$$\eta = \frac{P_{out}}{\sum_{k=1}^{M} P_k} = \frac{|V_{out}|^2}{\sum_{k=1}^{M} |V_k|^2}$$

Here, $P_k$ is the output power of the $k^{th}$ power amplifier, $V_k$ is the output voltage of the $k^{th}$ power amplifier, $P_{out}$ is the output power, and $V_{out}$ is the output voltage. This assumes 100% efficient power amplifiers and no combiner insertion loss. Note that if a symmetric dissipative isolating combiner is used, 100% efficiency can only be obtained when all the voltages being combined have the same amplitude. Therefore, there will be exactly N points of 100% efficiency in power output performance. When the voltages being combined have different amplitudes, there is loss in the combiner's isolation resistors.

Figure 4:
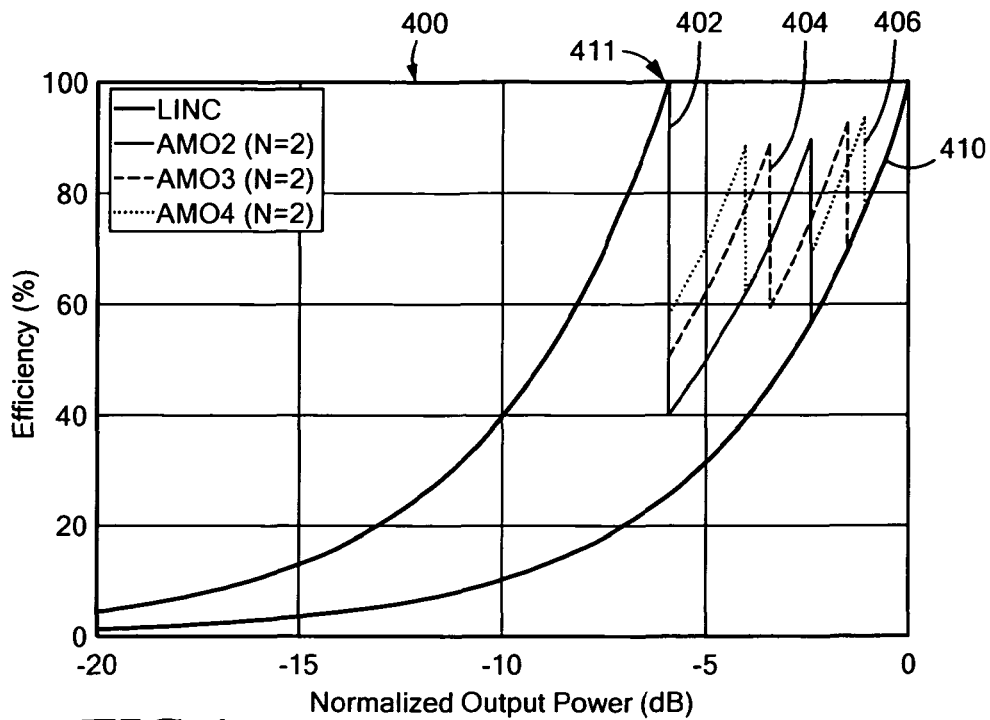
FIG. 4 is a graph showing power efficiency curves of AMO circuit embodiments having 2-way voltage levels.

Referring now to FIG. 4, a graph 400 has a horizontal axis denoting normalized output power in units of decibels (dB) and a vertical axis in percentage of power efficiency. In graph 400, theoretical power efficiency curves 402, 404, 406 are shown for respective M-way AMO circuits in which M=2, 3, 4, respectively, and in which N=2 voltage supply levels. A theoretical power efficiency curve 410 is also shown for a conventional linear amplification using non-linear components (LINC) circuit. The power efficiency curve for a given value of M (i.e., M=2, M=3, etc.) may be generated by first computing the efficiency vs. output power for each possible voltage combination, setting the efficiency to 0 if a given output power is unachievable for a given voltage combination, and taking the maximum efficiency over the different possible voltage combinations. Supply voltages have been selected such that two 100% efficiency points are separated by 6 dB. As can be readily seen in FIG. 4, a number of power efficiency peaks (an example of which is denoted by reference numeral 411) increases as M increases.

Figure 5:
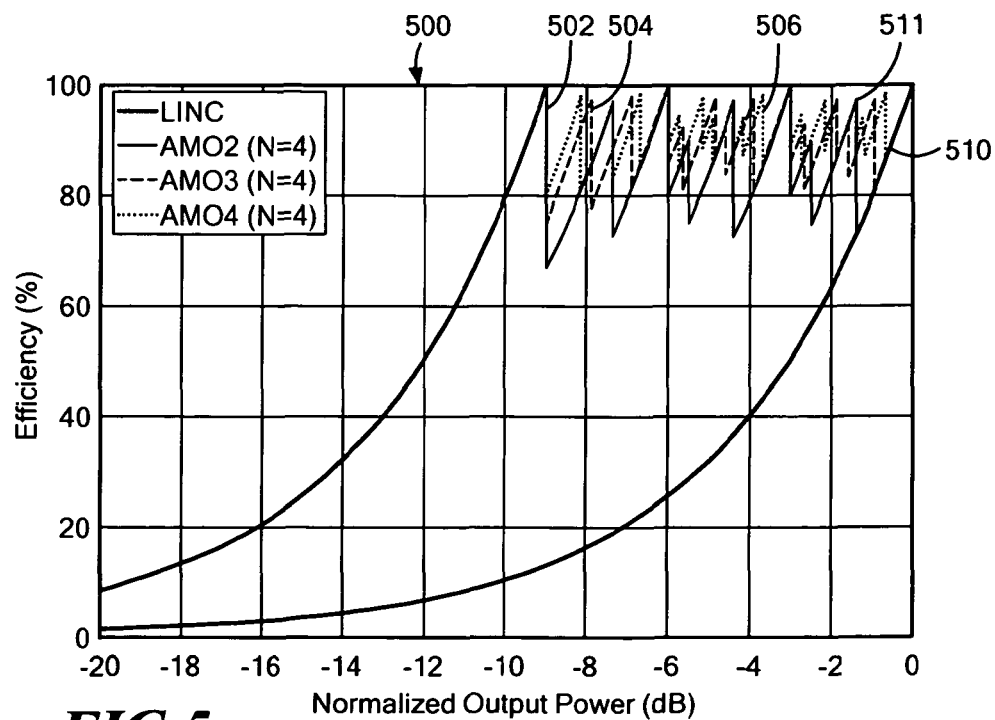
FIG. 5 is another graph showing power efficiency curves of further AMO circuit embodiments having 4-way voltage levels.

Referring now to FIG. 5, a graph 500 has a horizontal axis denoting normalized output power in arbitrary units of decibels (dB) and a vertical axis in percentage of power efficiency. In graph 500, theoretical efficiency curves 502, 504, 506 are shown for respective M-way AMO circuits in which M=2, 3, 4 and in which N=4 voltage supply levels. Also shown is a theoretical power efficiency curve 510 for a conventional LINC circuit. Supply voltages have been selected such that four 100% efficiency points are separated by 3 dB. As can be readily seen in FIG. 5, a number of power efficiency peaks (an example of which is denoted by reference numeral 511) increases as M increases.

For a given output voltage vector $V_{out} = A \cdot \exp(j \cdot \theta)$ and a given combination of power amplifier supply voltages, the phases for each of the power amplifiers can be computed as described herein below.

An output voltage may be defined as a vector sum of the M voltage vectors from each power amplifier as follows:

$$\vec{V}_{out} = \vec{V}_1 + \vec{V}_2 + \ldots + \vec{V}_M = A \angle \theta$$

The output voltage vector can be separated into real and imaginary components as follows:

$$Re(\vec{V}_{out}) = |V_1| \cos \phi_1 + |V_2| \cos \phi_2 + \ldots + |V_M| \cos \phi_M = A \cos \theta$$

$$Im(\vec{V}_{out}) = |V_1| \sin \phi_1 + |V_2| \sin \phi_2 + \ldots + |V_M| \sin \phi_M = A \sin \theta$$

These two equations yield M unknowns, which are the phases of the M power amplifiers. There are multiple possible solutions for M phases and, in some cases, no solution exists for a given amplitude A and a given set of voltage levels $V_k$. For purposes of illustration, the outphasing angles and voltage supply levels are calculated in such way as to minimize energy loss. Described here is method for the case of M=2. However, it should be understood that the method can be generalized to handle cases for which M>2.

In order to achieve an output vector with amplitude A, let the output amplitude of one power amplifier be $A_1$ chosen from a discrete set of possible values $V_k$, and that of the other be $A_2$, also chosen from the same set of discrete possible values. For each possible value of $A_1$ and $A_2$, the efficiency of the power combining operation can be calculated using the formula:

$$\eta_c = \frac{A^2}{A_1^2 + A_2^2}$$

All combinations of $A_1$ and $A_2$ for which this formula evaluates to a value exceeding 1 are impossible choices for realizing the output amplitude A. The values of $A_1$ and $A_2$ for which $\square_c$ is maximized (without exceeding 1) are the most efficient choices. That is, they result in the minimum outphasing angle and the minimum amount of wasted energy.

Once the values $A_1$ and $A_2$ are chosen, the proper phases for the two power amplifiers are given by the following equations:

$$\varphi_1(t) = \theta(t) + \cos^{-1} \frac{(V_1(t)^2 + 2A(t)^2 - V_2(t)^2)}{2\sqrt{2} \, V_1(t) A(t)}$$

$$\varphi_2(t) = \theta(t) - \cos^{-1} \frac{(V_2(t)^2 + 2A(t)^2 - V_1(t)^2)}{2\sqrt{2} \, V_2(t) A(t)}$$

In an AMO power amplifier circuit, as may be similar to RF circuit embodiment 100 described in conjunction with FIG. 1, output power and circuit conduction current levels change with the supply voltages delivered to the power amplifiers. The circuit conduction losses and switching losses decrease because the power supply input is switched to consecutively lower voltages as power is reduced. Gate drive power, however, does not experience similar reductions with output power, which can negatively impact efficiency at low output power levels.

Figure 6:
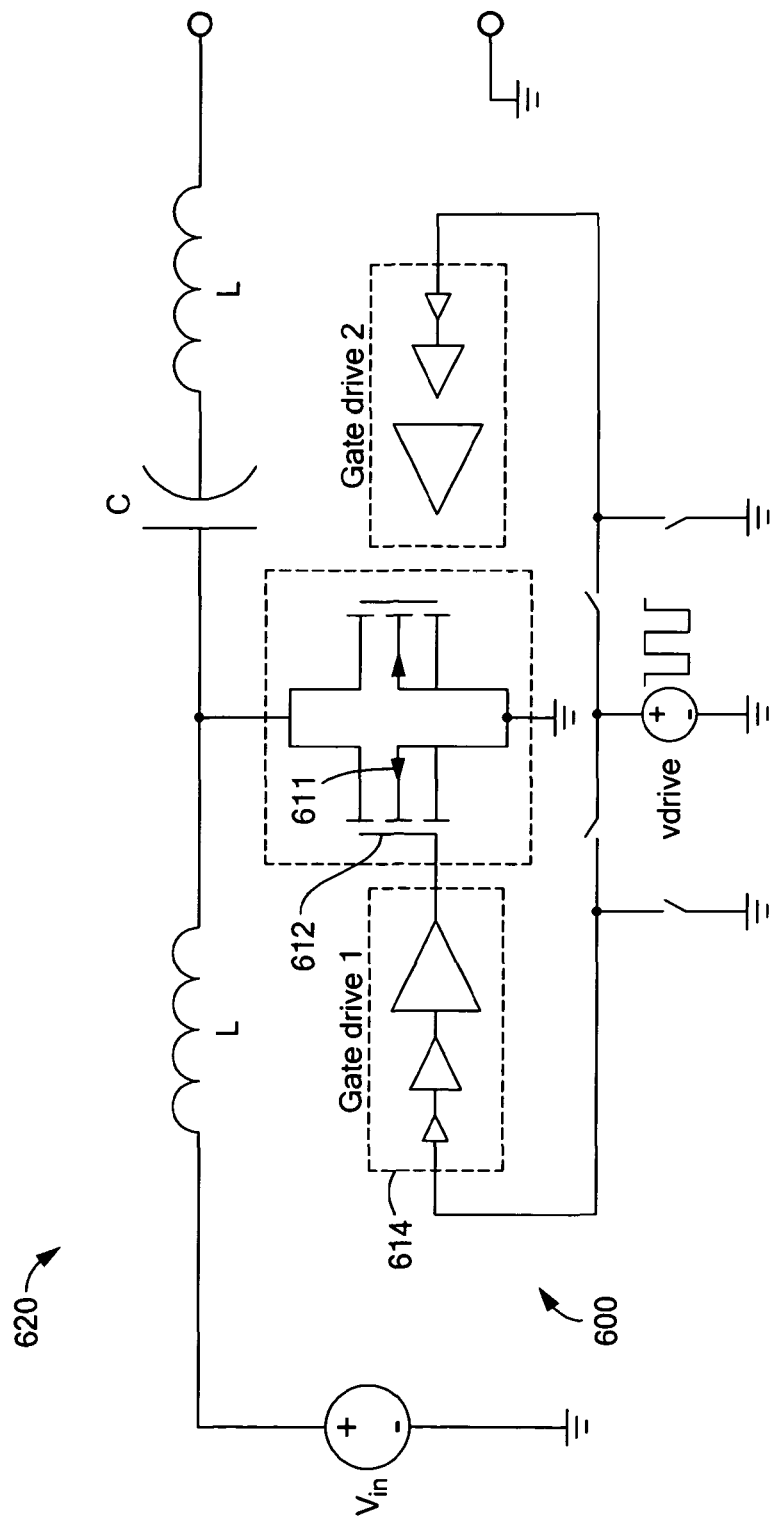
FIG. 6 is a circuit diagram of a width-switched power amplifier embodiment.

Referring now to FIG. 6, in some embodiments, an AMO power amplifier circuit includes a width-switching device 600 in a switching power amplifier 620, such as a class E switching amplifier. Such a device can parallel the output (drain-source) ports of multiple transistors 611 and drive transistor gates 612 with separately controlled gate drives 614. At low power levels, some of the gate drives 614 can be disabled (or otherwise driven to leave transistors 611 off) to save gating power. In such a way, gate drive loss reduction may be traded off for increase in on-state conduction, which can allow optimization of the number of transistor elements gated as a function of power level. More particularly, a number and relative size of width-switching devices 600 can be provided and driven separately at an input source (and operated in parallel at transistor outputs) so as to provide good efficiency over a desired power range.

In an exemplary operation of width-switching device 600, when $V_{in}$ is relatively large (for example, selected as a large input voltage for high power output), a first gate drive (i.e. gate drive 1) and a second gate drive (i.e., gate drive 2) provide AC gate-drive switching signals to transistors 611. Alternatively, when $V_{in}$ is relatively small (for example, selected as a small input voltage for lower power output) one of the gate drive switching signals is modified to hold the gate drive output low to deactivate one of the transistors while another one of transistor is gated on and off.

In a further embodiment, first and second gate drives provide substantially similar gating patterns.

In another embodiment, at least one of the gate drives is a plurality of coupled amplifiers.

In a further embodiment, more than two width-switching devices could be sized equally in a geometric sizing arrangement (e.g., widths A, 2A, 4A, etc.) or other sizing strategy. In still further embodiments, devices are matched to realize an optimum lowest loss for different power amplifier input voltages of the AMO circuit. This can enable high efficiency at each power supply level in the AMO circuit.

Referring again to FIG. 1, in a further RF circuit embodiment each of the power amplifiers 120A, 120B-120N has an RF input port 126A, 126B-126N (generally designated by reference numeral 126) configured to receive respective phase-adjusted signals $\phi_1$, $\phi_2$-$\phi_N$ (generally denoted by reference numeral 135). Furthermore, the switch network 130 is configured to receive a plurality of control signals $V_{C1}$, $V_{C2}$-$V_{CN}$ (generally designated by reference numerals 125).

As will be described herein below, the phase-adjusted signals 135 and control signals 125 control the output signal 144 of the RF circuit.

In still a further embodiment, a control system 150, which receives as input an amplitude A and a phase φ, is configured to provide the phase-adjusted signals 135 over a plurality of first output ports 154 coupled the RF input ports 126 of the power amplifiers 120 and the control signals 125 over a plurality of second output ports 152 coupled to the switch network 130.

Figure 7A:
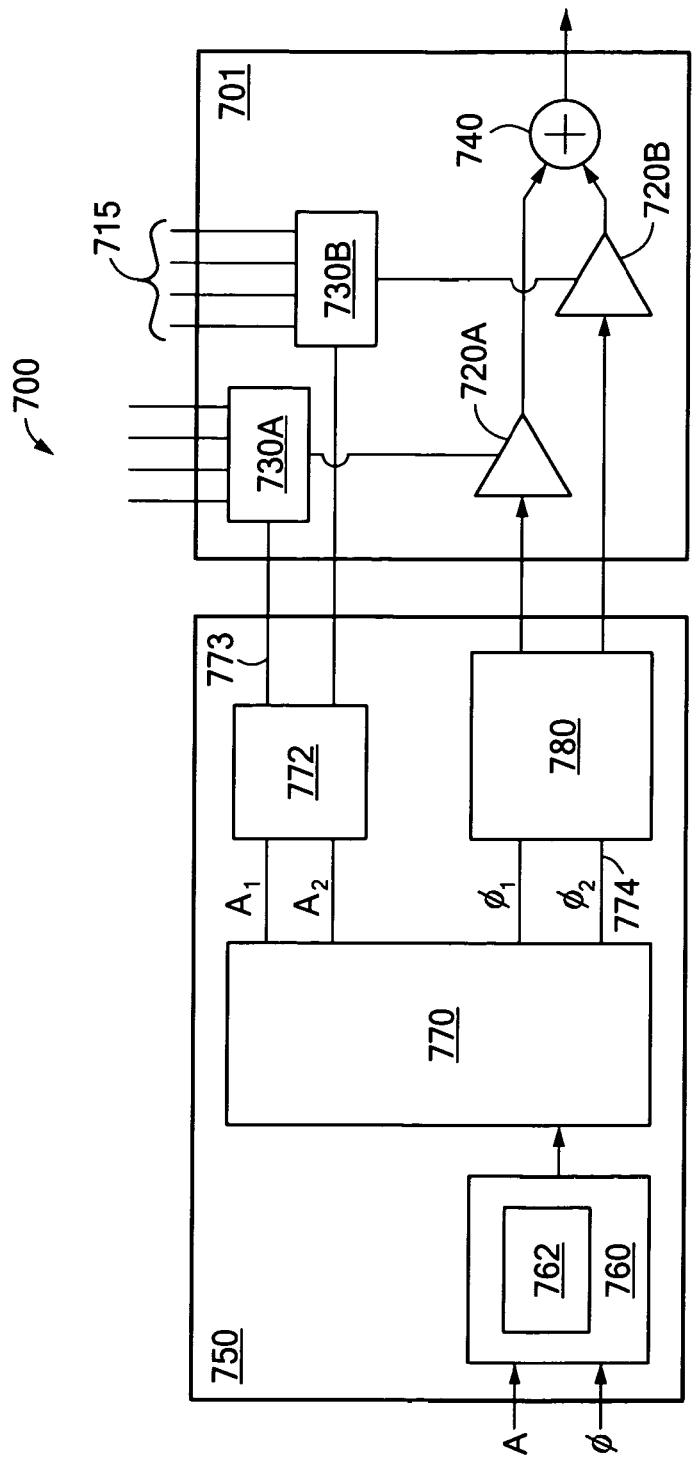
FIG. 7A is a block diagram of a two power amplifier/four voltage level circuit embodiment including a control system.

Referring now to FIG. 7A, in a further embodiment an AMO circuit 700 includes a control system 750 and an RF circuit 701. The control system 750 includes a predistorter 760, an AMO modulator 770, and a digital radio frequency power converter (DRFPC) 780 for modulating a baseband signal comprising amplitude A and phase φ components. The RF circuit 701, which may be a further embodiment of the RF circuit embodiment 100 described in conjunction with FIG. 1, includes a first switch 730A and a second switch 730B for selecting voltage levels 715 supplied to respective first power amplifier 720A and second power amplifier 720B. The voltage levels 715 are received from a power supply (not shown) as may be similar to power supply 110 described in conjunction with FIG. 1. In a further embodiment, the AMO modulator 770 drives a fast switching network and switching mode amplifiers, which may include, but are not limited to, class-E, class-F, class-φ, and/or class E/F power amplifiers. An RF power combiner 740 combines the outputs of first and second power amplifiers 720A, 720B, while providing isolation between its input ports.

The predistorter 760 linearizes the combined non-linearity from the DRFPC 780, switches 730A, 730B, and power amplifiers 720A, 720B. A polar lookup table 762 is used to store lookup values for amplitude A and phase φ components as will be described herein below. The AMO modulator 770 determines a combination of two power voltages 715 supplied to the power amplifiers 720A, 720B based on a peak amplitude within a time interval, which in a further control system embodiment is determined in a interval peak detector. The AMO modulator 770 decomposes a predistorted amplitude and phase received from the predistorter 760 into a pair of amplitude values (A$_1$, A$_2$) and a pair of phase values (φ$_1$, φ$_2$) using a first-order approximation of equations 3A and 3B described herein below. In a further embodiment, the AMO modulator includes a time aligner 772 to maintain any time delay mismatch between amplitude paths 773 and phase paths 774 to within the margin required by a particular application.

The DRFPC 780 performs phase modulation by embedding phase components φ$_1$, φ$_2$ of the AMO modulator output into an RF carrier signal. The DRFPC 780 includes an array of current steering switches and can bring a significant transmitter power efficiency boost particularly for low output power levels for two reasons. First, the analog matching requirement in the current steering switches is relaxed because the static phase errors in the DRFPC output, which result from analog mismatch, can be corrected by the predistorter 760. Second, the DRFPC 780 does not need baseband active filters for DAC output shaping.

Figure 7B:
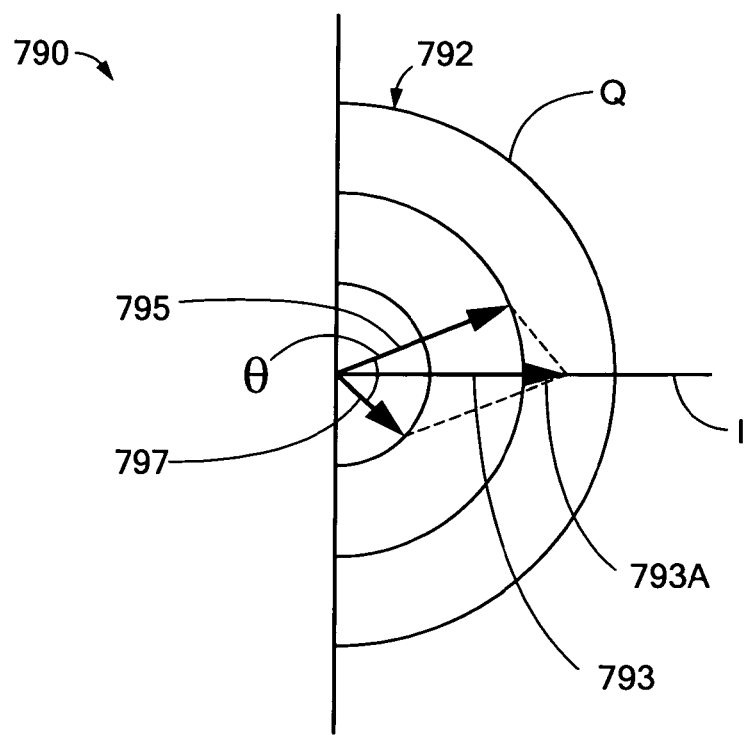
FIG. 7B is polar coordinate graphical representation of coordinates (I, Q) of a baseband signal.

Referring now to FIG. 7B, an exemplary operation of an asymmetric multilevel outphasing (AMO) modulation technique to determine control voltages and phase components will now be described. A graph 790 is a polar representation in coordinates (I, Q) of a baseband signal. Half circles (an example of which is designated by reference numeral 792) correspond to discrete amplitude values. The graph 790 includes a complex vector 793 at a phase-amplitude baseband constellation point 793A.

The AMO modulation technique decomposes the complex vector 793 into a first vector 795 and a second vector 797. The first and second vectors 795, 797 are a baseband representation of outputs of power amplifiers, as may be similar to power amplifiers 720A and 720B of the RF circuit embodiment 701 described in conjunction with FIG. 7A. An outphasing angle θ is defined between the first and second vectors 795, 797.

Mathematically, AMO modulation technique can be defined with the polar representation of the baseband signal, according to the following equation:

$$C(t) = r_i(t) + jr_q(t) = A(t)e^{j\theta(t)} \quad (1)$$

Here, C represents a baseband signal over time t, and $r_i$ and $r_j$ are respective real and imaginary coordinates of baseband signal C. In equation (1), A represents amplitude and θ represents the angle.

C(t) can be linearized by predistorting power amplifier output using a polar lookup table (as may be similar to polar lookup table 762 described in conjunction with FIG. 7A) using the following equation:

$$P(t) = A_p(t)e^{j\theta p(t)} \quad (2)$$

Here, θ$_p$ is the lookup table value. In an RF circuit including a first and a second power amplifier (as may be similar to RF circuit 701 described in conjunction with FIG. 7A), P(t) can be decomposed into two parts using the following equation:

$$P(t) = W(V_1(t)e^{j\Phi 1(t)}, V_2(t)e^{j\Phi 2(t)}) \quad (3A)$$

Here, V$_1$ represents a first voltage level output at time t from the first power amplifier and proportional to the input power supply voltage into the first power amplifier and V$_2$ represents a second voltage level output at time t from the second power amplifier and proportional to the input power supply voltage into the second power amplifier. W represents Wilkinson power combining. In this way, voltage levels (i.e., first voltage level and second voltage level) can be dynamically selected over time and/or at various times during operation of the AMO circuit. Advantageously, the AMO circuit is able to adjust to dynamic power-efficiency needs of an application.

A first phase component φ$_1$ representing a first phase input to the first power amplifier and a second phase component φ$_2$ representing a second phase input to a second power amplifier can be calculated as follows:

$$\varphi_1(t) = \theta_p(t) + \cos^{-1}\frac{(V_1(t)^2 + 2A_p(t)^2 - V_2(t)^2)}{2\sqrt{2}\, V_1(t)A_p(t)}, \quad (3B)$$

$$\varphi_2(t) = \theta_p(t) - \cos^{-1}\frac{(V_2(t)^2 + 2A_p(t)^2 - V_1(t)^2)}{2\sqrt{2}\, V_2(t)A_p(t)}$$

The AMO modulation technique can be used to optimize efficiency of an RF circuit (as may be similar to RF circuit embodiment 100 described in conjunction with FIG. 1) by minimizing power loss in a power combiner (as may be similar to RF power combiner 140 described in conjunction with FIG. 1). An optimal value of each level r$_k$ can be determined, in which levels r$_k$ are the maximum output amplitudes A for each supply voltage levels when a power supply drives power amplifiers (as may be similar to power supply 110 and power amplifiers 120A and 120B described in conjunction with FIG. 1). The Wilkinson combiner efficiency at a given output amplitude A driven by two power amplifiers with different supply voltages can be represented according to the following equation:

$$\eta_c(A, r_k, r_j) = \frac{A^2}{r_k^2 + r_j^2} \quad (4)$$

Equation (4) simplifies to a standard Wilkinson efficiency when $r_k = r_j$. The total average efficiency can be computed if the amplitude power distribution function (PDF) p(A) of the signal is known. For example, total average efficiency can be computed by dividing the PDF into several regions separated by the $r_k$ (and $r_k$ combinations), integrating the PDF curve to find the efficiency in each region, and summing the result. For N different supply voltages, there will be $$\binom{N}{2}$$

combination of supply voltages given two power amplifiers. However, the power combiner efficiency decreases as the difference between two voltage levels increases. Also, the efficiency improvement may be relatively small when the difference between the two voltages is relatively large. Therefore, the supply voltage combinations can be restricted to adjacent voltage supply levels (i.e., $r_k$ and $r_{k+1}$). Using this restriction together with the known PDF of the transmitted signal, the optimum combination of supply voltages can be determined by exhaustive search.

Although AMO modulation has been described using Wilkinson power combining, one of ordinary skill in the art will readily appreciate that other power combining techniques may be used. Furthermore, although AMO modulation has been described with reference to two power amplifiers, such is not intended as limiting and one of ordinary skill in the art will readily appreciate that more than two power amplifiers may be used.

Figure 8:
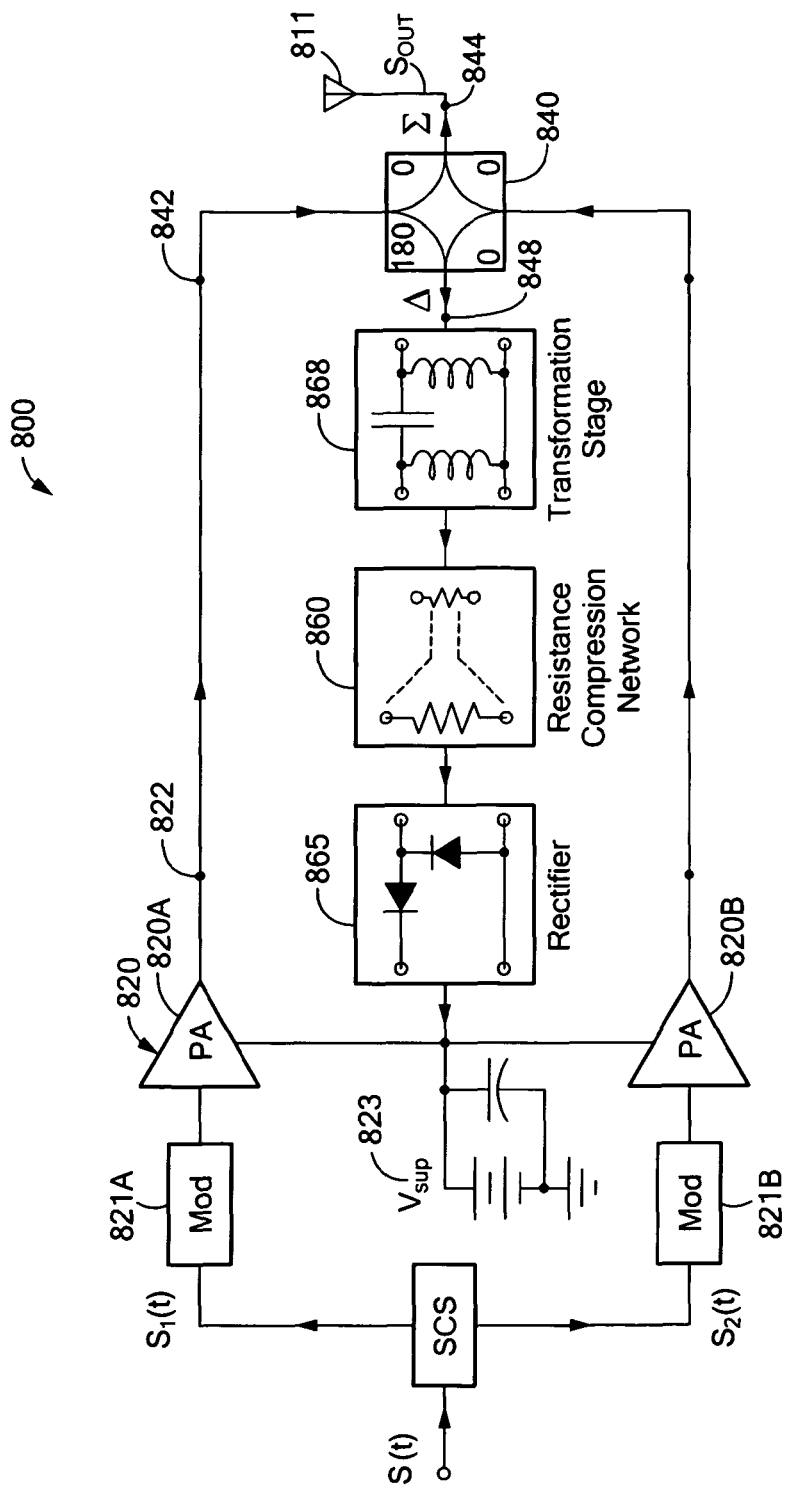
FIG. 8 is a block diagram of an embodiment of an outphasing energy recovery amplifier.

Referring now to FIG. 8, in another aspect an RF circuit 800 includes a plurality of power amplifiers 820, each having an RF output port 822 and an RF power combiner circuit 840 having a plurality of input ports 842 coupled to respective ones of the RF output ports 822 of the plurality of power amplifiers 820. The RF power combiner 840 includes a resistance compression network (RCN) 860, a rectification circuit 865 coupled to the resistance compression network 860, and an output port 844 at which is provided an output signal $S_{out}$ of the RF circuit 800. The RF circuit output port 844, in some embodiments, is coupled to a load 811, such as an antenna.

In a further embodiment, an impedance transformation stage 868 is coupled to an isolation port 848 of the power combiner 840 and the RCN 860. The impedance transformation stage 868 matches a RCN impedance to an impedance required by the power combiner 840.

The RF circuit embodiment 800 of FIG. 8 includes a first power amplifier 820A and a second power amplifier 820B. In some embodiments, the first power amplifier 820A receives a first signal $S_1(t)$ output from modulator 821A and the second power amplifier 820B which receives a second signal $S_2(t)$ output from modulator 821B. In the same or different embodiment, a source signal S(t) may be fed through a sinusoidal signal source (SCS) to provide signals $S_1(t)$ and $S_2(t)$. A voltage supply 823 provides power to each of the power amplifiers 820A, 820B and recovers power from RF power combiner 840 as will be described herein below.

An exemplary operation of the RF circuit embodiment 800 will now be described. Because the power combiner 840 requires a fixed resistance at the isolation port 848 to ensure matching and isolation between the first and second outphased power amplifiers 820A, 820B, the RF-dc converter which recovers the wasted power should provide a constant resistive impedance at its input. A purely resistive input impedance can be achieved with a variety of rectifier structures, a non-limiting example of which includes an ideal half bridge rectifier driven by a sinusoidal current source of amplitude $I_{in}$ and frequency $\omega_s$, and having a constant output voltage $V_{dc}$. A voltage at the input terminals of the rectifier $V_x(t)$ will be a square wave having a fundamental component of amplitude $V_{x1} = (2V_{dc}/\pi)$ in phase with an input current $I_{in}(t)$. The electrical behavior at the fundamental frequency $\omega_s$ (neglecting harmonics) can be modeled as a resistor of value $R_{eq} = (2 \pi)(V_{dc}/I_{in})$. One of ordinary skill in the art will readily appreciate that there are many other types of rectifier topologies that can achieve the above-mentioned behavior.

Driving a rectifier (such as the above-described ideal half bridge rectifier) with a tuned network suppresses the harmonic content inherent in rectifier operation and results in a resistive impedance characteristic at a desired frequency. This equivalent resistance can be represented by the following equation:

$$R_{rect} = k_{rect} \frac{V_{dc}}{|I_1|} \quad (5)$$

where $k_{rect}$ depends on the specific rectifier structure and $|I_1|$ is the fundamental component of the drive current. Ignoring harmonics, the power delivered to the rectifier is $P_{in} = \frac{1}{2} I_{in}^2 R_{rect}$. The rectifier impedance can be written as follows:

$$R_{rect} = \frac{(k_{rect} V_{dc})^2}{2 P_{in}} \quad (6)$$

Equation (6) shows that the rectifier input impedance is inversely proportional to input power. The equivalent input impedance of the rectifier varies with input power which can reduce the isolation between the power amplifiers and can lower power amplification efficiency (and in some instances, cause complete malfunction) and increase unwanted signal distortion at the output.

To mitigate these unwanted effects, an RCN 860 is included to reduce the rectifier impedance variation. The RCN 860 can be combined with an appropriate set of rectifiers 865 to yield an RF-dc converter with narrow-range resistive input characteristics.

Although operation of the outphasing energy recovery amplifier 800 of FIG. 8 has been described with reference to two power amplifiers 820A, 820B, such is not intended as limiting and one of ordinary skill in the art will readily appreciate that more than two power amplifiers may be used, and that one may choose to use additional resistance compression networks 860 and rectifiers 865 to recover additional energy that would otherwise be dissipated in the power combining process. Moreover, although operation of the outphasing energy recovery amplifier 800 of FIG. 8 has been shown with energy recovery directly to a power supply applied to the two amplifiers 820A, 820B, one of ordinary skill in the art will readily appreciate that energy may be recovered to any other storage location that may be convenient, and that power supplies for the power amplifiers 820 could be derived elsewhere (e.g., for AMO modulation).

Figure 9:
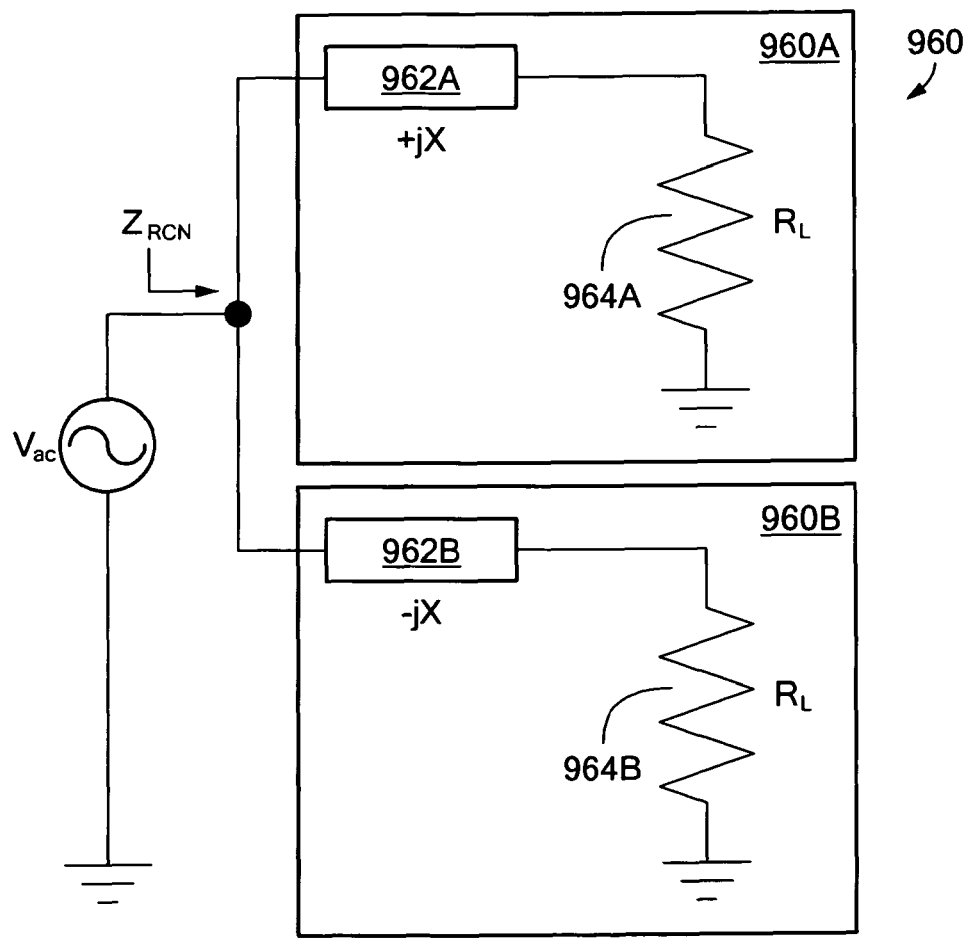
FIG. 9 is a block diagram of an embodiment of a resistance compression network embodiment used in the amplifier embodiment of FIG. 8.

Referring now to FIG. 9, in some embodiments an RCN 960 includes a first RCN element 960A and a second RCN element 960B, characterized by a resistive Input characteristic that varies little as the input power changes. The first RCN element 960A includes a first conjugate reactance 962A in series with a first matched load resistance 964A and the second RCN element 960B includes a second conjugate reactance 962B in series with a second matched load resistance 964B. First and second RCN elements 960A, 960B represent an equivalent resistance of two rectifiers as given by equation (6). The reactive branches are designed to have the specified reactance X at the designed operating frequency. It can be shown that at this frequency the input impedance of the RCN 960 will be resistive with a value $R_{RCN}$ indicated as follows:

$$R_{RCN} = \frac{X^2}{2R_{rect}}\left[1+\left(\frac{R_{rect}}{X}\right)^2\right] \quad (7)$$

In this way, compression of matched load resistances $R_{rect}$ is provided about a center value of impedance X. For variations of $R_{rect}$ over a range having a geometric mean of X (i.e., $R_{rect} \in [(X/c_{rect}^{1/2}), c_{rect}^{1/2}X]$, where $c_{rect}$ is the ratio of the largest to smallest resistances in the $R_{rect}$ range), the corresponding ratio of the compressed $R_{RCN}$ range can be shown to be as follows:

$$c_{RCN} = \frac{1+c_{rect}}{2\sqrt{c_{rect}}} \quad (8)$$

For example, a 10:1 variation in $R_{rect}$ ($c_{rect}=10$) results in a modest 1.74:1 variation in $R_{RCN}$. Since $R_{rect}$ is inversely proportional to $P_{in}$ as shown in equation (6), this means a 10:1 variation in power delivered to the isolation port would result in only a 1.74:1 variation in isolation port resistance. This narrowed range of resistance will result in substantially improved isolation between the outphased power amplifiers (as may be similar to outphased power amplifiers 820A, 820B described in conjunction with FIG. 8), greatly improving amplification efficiency.

It should be noted that at sufficiently high output power levels (i.e., low power levels to the rectifiers), the rectifier resistance can no longer be effectively compressed. This is because at low input power levels, the diodes will be unable to turn "on" and overcome the combination of supply voltage and diode built-in potential. When the diodes turn "off", equations (5) and (6) are no longer valid and the efficiency of the RCN drops considerably. However, this poses no serious problems. In this region of operation, most of the power from the power amplifiers is delivered to the load, and so the isolation port acts as a virtual open circuit. Therefore, the rectifier impedance and the efficiency of the RCN do not matter.

Figure 10:
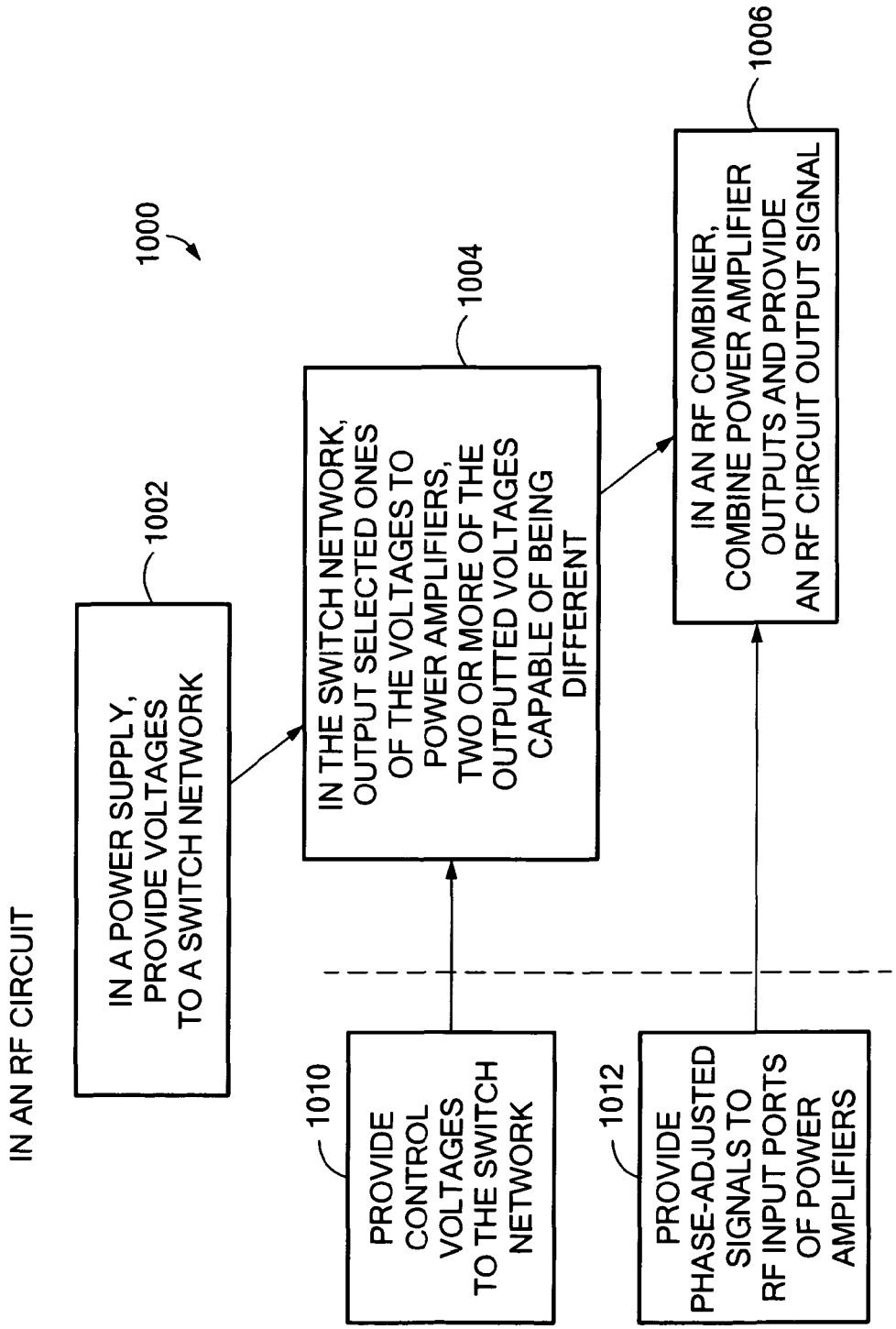
FIG. 10 is a flow diagram of an asymmetric multilevel outphasing transmission method.

Referring now to FIG. 10, an RF transmission method 1000 includes, in a power supply, providing voltages to a switch network 1002, in the switch network, outputting selected ones of the voltages to power amplifiers, two or more of the outputted voltages capable of being different 1004, and, in an RF combiner, combining power amplifier outputs and providing an RF circuit output signal 1006. In a further embodiment, the method 1000 includes providing control voltages to the switch network 1010 and providing phase-adjusted signals to RF input ports of the power amplifiers 1012.

In a further embodiment, the method 1000 includes decreasing a difference between a sum of the powers outputted by the power amplifiers and an RF power outputted at the output port of the RF circuit. In still a further embodiment, the method 1000 includes minimizing the difference between the sum of the powers outputted by the power amplifiers and the RF power outputted at the output port of the RF circuit.

In a further embodiment, the method 1000 includes gating on a variable number of transistors in at least one of the power amplifiers.

In a further embodiment, the method 1000 includes, in the RF combiner circuit, providing isolation between the plurality of Input ports.

In a further embodiment, the method 1000 includes processing at least a portion of the RF power output from the power amplifiers using at least one resistance compression network and at least one rectification circuit coupled to the at least one resistance compression network, wherein the processed RF power includes recovered RF power from the RF power combiner circuit.

Figure 11A:
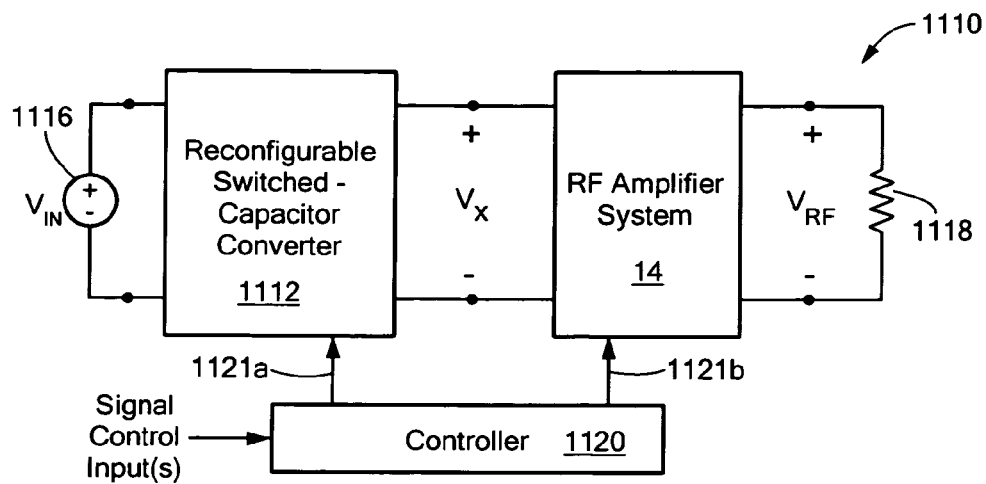
FIG. 11A is a block diagram of a circuit comprising a reconfigurable switched capacitor (SC) transformation stage coupled to a radio frequency (RF) amplifier system.

Referring now to FIG. 11A, a circuit 1110 for providing dc-to-rf conversion includes a first stage corresponding to a reconfigurable switched capacitor (SC) converter 1112 having a pair of input terminals coupled to a voltage source $V_{in}$ and a pair of output terminals at which an intermediate voltage $V_x$ is provided. It should be noted that voltage source $V_{in}$ is here show in phantom since it is not properly a part of the do-to-rf conversion circuit 1110. DC-to-rf conversion circuit 1110 further includes a second stage corresponding to an RF amplifier system 1114 coupled to the reconfigurable (SC) converter output terminals.

A controller circuit 1120 is adapted to receive a signal control inputs and in response thereto (and in accordance with a desired operating mode) provides control signals on paths 1121a, 1121b to either or both of the SC converter stage 1112 and RF amplifier system 1114, respectively.

Figure 13:
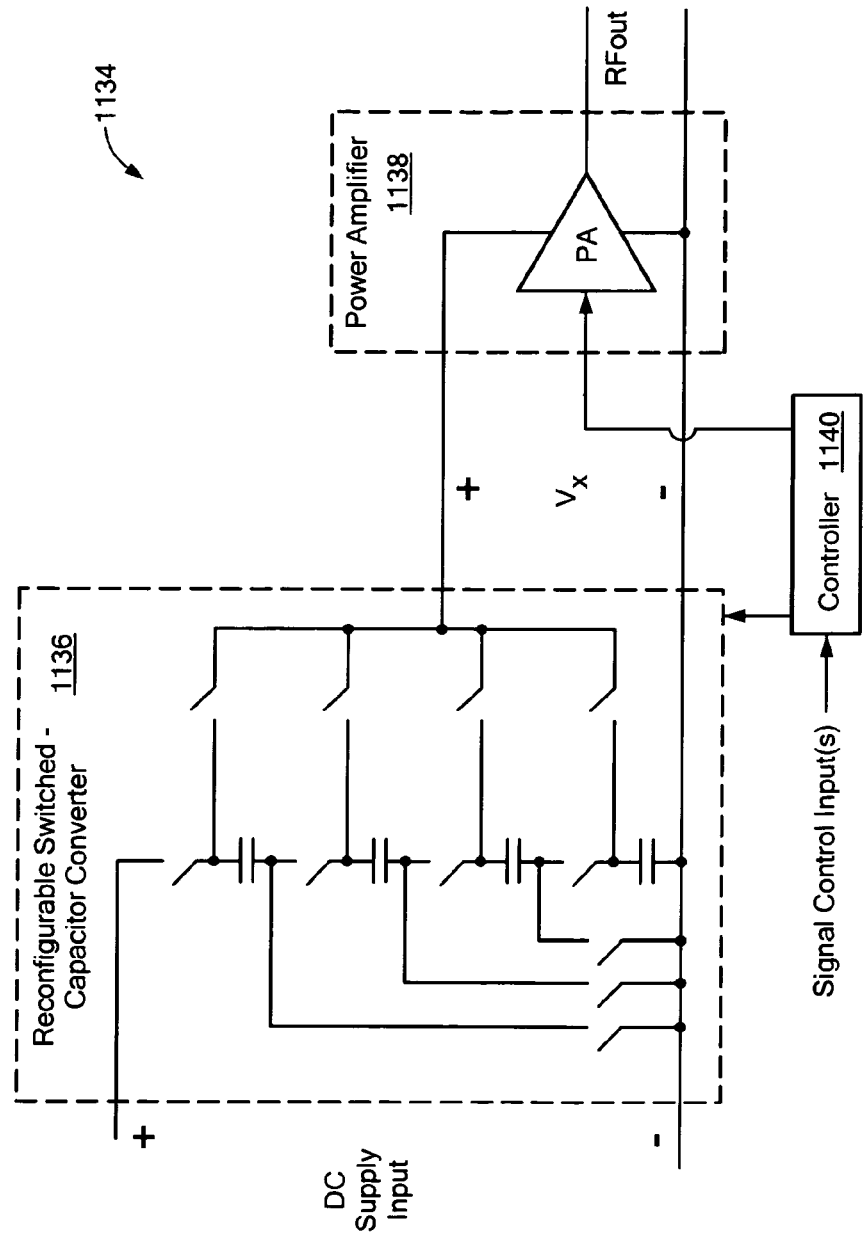
FIG. 13 is a block diagram of a circuit comprising a reconfigurable switched capacitor (SC) transformation stage operable in series-parallel modes coupled to a radio frequency (RF) power amplifier (PA) circuit.

Reconfigurable SC converter 1112 includes a network of switches and capacitors and controller 1120 provides signals to turn the switches on and off periodically or aperiodically to cycle or switch the reconfigurable SC converter through different topological states. It should be appreciated that some embodiments may further comprise means for dynamically controlling a conversion ratio of the first power conversion stage such that the intermediate voltage can be modulated as a function of any of: (a) an input voltage; (b) a reference voltage; or (c) an rf output amplitude. In such an embodiment, the conversion ratio of the first power conversion stage can be dynamically controlled such that the intermediate voltage can be modulated as a function of the input voltage, a reference voltage, or the desired rf output amplitude. For example, by dynamically changing the conversion ratio to provide lower intermediate voltages when lower RF output amplitudes are desired, the losses in the RF power amplifier(s) can be reduced and higher system efficiency attained. An example design of this type is illustrated in FIG. 13 which will be described in detail below. It should also be noted that while many embodiments will operate periodically (for a given conversion ratio), embodiments may be realized in which there is no definite periodic cycling of the switching patterns.

Figure 11B:
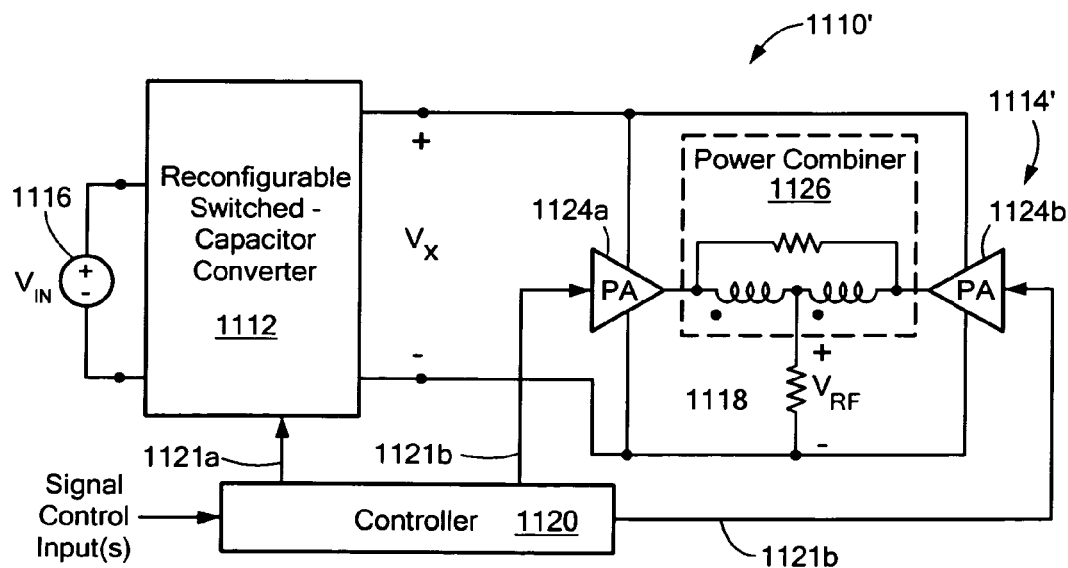
FIG. 11B is a block diagram of a circuit comprising a reconfigurable switched capacitor (SC) transformation stage coupled to a radio frequency (RF) power amplifier (PA) circuit.

Referring now to FIG. 11B in which like elements of FIG. 11A are provided having like reference designations, RF amplifier system 1114' is here provided from a pair of powers amplifiers (PAs) 1124a, 1124b coupled through a combiner circuit 1126 to load 1118. Controller 1120 includes a pair of control lines 1121b which are coupled to respective ones of the PA's.

Referring now to FIG. 112A, a circuit 1128 for providing dc-to-rf conversion includes a first stage 30 (also referred to as a "reconfigurable switched capacitor transformation stage" or a "switched capacitor stage") and a second stage 1132 corresponding to an RF amplifier. A voltage source 1134 (here shown in phantom since it is not properly a part of the dc-to-rf conversion circuit 1128) is coupled between a pair of input terminals 1130a, 1130b of the first stage 1130. An output voltage $V_x$ is generated across output terminals 1130c, 1130d of stage 1130.

Switched capacitor stage 1130 receives the input voltage (e.g. $V_1$) and operates to provide a transformed or intermediate voltage $V_x$ at terminals 1130c, 1130d. Thus transformed voltage $V_x$ is provided to input terminals of a load here corresponding to an RF amplifier stage 1132.

It should be appreciated that the input voltage $V_{in}$ vary over a relatively wide voltage range. The particular voltage range over which the input voltage may vary depends upon the particular application. For example, in some applications the range of input voltages may be from about 1.5 volts (V) to about 5.0V. In other applications the range of input voltages may be from about 6V to about 12V. In still other applications the input voltage range may be from about 10V to about 14V. For example, in a converter circuit for battery-powered portable electronics applications, operation may be typically be required across an input voltage range from 2.4 V to 5.5 V.

Regardless of the input voltage, however, switched capacitor stage 1130 maintains transformed voltage $V_x$ over a voltage range which is appropriate for use with the load coupled thereto—e.g. the RF amplifier 1132 (or other load). Furthermore, the transformation ratios utilized by switched capacitor stage 1130 may be selected as a function of the input voltage $V_{in}$. For example, the conversion ratio of the switched capacitor stage 1130 may be dynamically selected from among the allowed set of conversion ratios such that the intermediate voltage $V_x$ will be as large as possible while remaining below a specified maximum voltage. Thus, by adjusting a transformation ratio, switched capacitor stage 30 can accept a first range of input voltages while providing an appropriate voltage to the second or RF amplifier stage. Alternatively, the conversion ratio of the switched capacitor stage 1130 may be dynamically selected from among the allowed set of conversion ratios such that the Intermediate voltage $V_x$ will be as small as possible while enabling the subsequent RF amplifier stage to synthesize a desired output. For cases where the voltage across C1 is controlled to remain near half of the input voltage $V_{in}$, allowable voltage conversion ratios may include 1 and ½ (and the corresponding allowed current conversion ratios may include 1 and 2).

The SC converter stage 1130 includes one or more switch components and one or more energy storage components. The components which provide the SC converter stage 1130 are selected such that SC converter stage 1130 has a switching frequency which is relatively low compared with the switching frequency of the RF amplifier stage. Thus, the SC converter stage 1130 may be referred to a low frequency stage while the second stage (or RF amplifier stage) may be referred to as a high frequency stage.

The difference in switching speeds of the SC converter stage and RF amplifier stage switches (i.e. the frequency separation between the switching frequencies of the switches) is selected based upon a variety of factors including but not limited to the gating and switching loss characteristics of the switches. It should, of course, be appreciated that a tradeoff must be made between switching frequency and the voltage levels (and/or range of voltages) which must be accepted by and provided by the transformation and regulation stages.

SC converter stage 1130 includes a first plurality of serially coupled switches S1-S4 coupled between terminals 1130a and 1130b. In the exemplary embodiment of FIG. 12A, switches S1-S4 are each provided as single-pole, single-throw switches. In many applications, these may be provided as transistors, including metal oxide semiconductor filed effect transistors (MOSFETs), junction FETs (JFETs), or high electron mobility transistors (HEMTs).

A first capacitor $C_1$ has a first terminal coupled to a node between switches S1 and S2 and a second terminal coupled to a node between switches S3 and S4. A first output terminal 1130c is coupled to a node between switches S2 and S3 and a second output terminal is coupled to a common node of switch S1 and to a negative terminal of the voltage source 1134. Thus, do-to-rf conversion circuit 1128 comprises four switches and a single energy transfer capacitor $C_1$.

The dc-to-rf conversion circuit 1128 effectively provides one of two voltage levels to the second stage 1132 (and permits rapid dynamic switching among levels) as shown in Table 1 below.

TABLE 1

| State | Switches On | Capacitor Voltage Modulator Output Voltage $V_x$ | Approximate Voltage Value |
| --- | --- | --- | --- |
| A | S1, S2, S3, S4 | Vin | Vin |
| B | S1, S2, S3 | Vc | 0.5 Vin |

Table 1 shows the switch states and resulting intermediate voltages provided by the SC converter circuit 1130. To understand operation of the capacitor voltage modulator circuit, consider the following: the circuit is controlled to maintain the capacitor voltage $V_c$ near $V_{in}/2$, while providing a voltage $V_x$ to the second stage that can be selected from one of (approximately) $V_{in}$ or $0.5V_{in}$. This is achieved by selecting appropriate switch states as indicated in Table 1. Voltage $V_x$ equal to $V_{in}$ can be maintained indefinitely (by selecting state A). A voltage $V_x$ close to 0.5 $V_{in}$ can be achieved by selecting state B. It will be recognized that the capacitor $C_1$ may be soft charged and discharged (or adiabatically charged and discharged) by the RF amplifier stage, enabling reductions in one or more of the size, switching frequency and loss of the switched-capacitor stage.

Figure 12A:
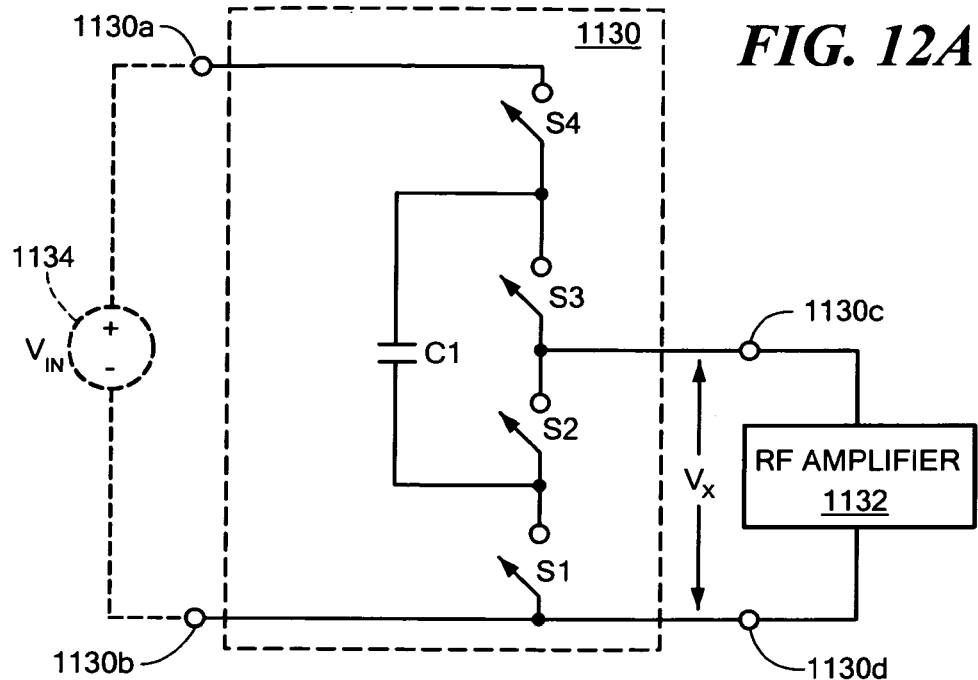
FIG. 12A is a block diagram of a reconfigurable switched capacitor (SC) transformation stage.
Figure 12B:
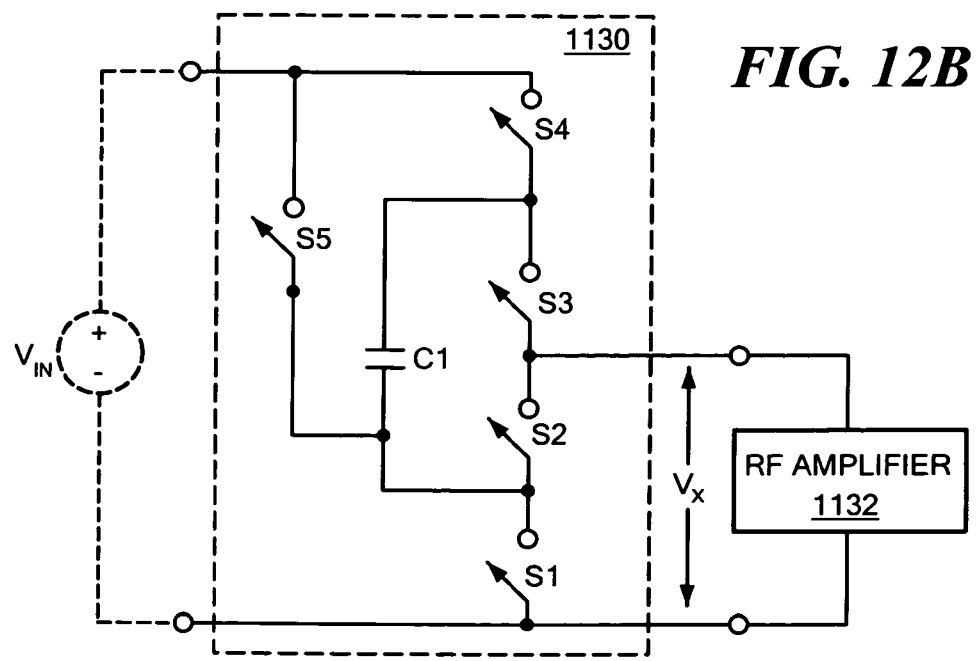
FIG. 12B a reconfigurable switched capacitor (SC) voltage modulator having an additional switch providing a conversion ratio that cannot be maintained indefinitely.

Referring now to FIG. 12B, in which like elements of FIG. 12A are provided having like reference designations, in this embodiment, switched capacitor voltage modulator stage 1130 includes a fifth switch S5 having a first terminal coupled to the positive terminal of source $V_{in}$ and a second terminal coupled to a terminal of capacitor C1 which is also coupled to a node between switches S1 and S2. When switch S5 is closed together with switch S3, output voltage Vx can be made to be Vin+Vc, or approximately 1.5 Vin, though this state cannot be maintained indefinitely. In the exemplary embodiment of FIG. 12B, switches S1-S5 are each provided as single-pole, single-throw switches.

Referring now to FIG. 13, a reconfigurable switched capacitor converter 1134 includes a first stage 1136 provided as a "series-parallel" switched capacitor converter that can be operated at 4:1, 2:1 and 1:1 voltage conversion ratios (or more precisely, 1:4, 1:2, and 1:1 current conversion ratios) and a second stage 1138 provided as an RF amplifier and in this exemplary embodiment as an RF power amplifier. As mentioned above, FIG. 13 is an example of a circuit which can change the switching pattern of the circuit operation to dynamically change the conversion ratio from the dc supply input to intermediate voltage $V_x$. By dynamically changing the conversion ratio to provide lower intermediate voltages when lower RF output amplitudes are desired, the losses in the RF power amplifier(s) can be reduced and higher system efficiency attained.

It should be noted that in many implementations the second stage can be "merged" with the first stage such that "soft" or "adiabatic" charging and/or discharging of the capacitors in the first stage is achieved, providing reduced capacitor size and/or loss. That is, because the second stage operates at a far higher frequency than the switching rate of the first stage, it can effectively act as a "current" load of the first stage (on the time scale of switching the first stage), such that "impulse charging" or discharging of the capacitors in the first stage is reduced or eliminated. This is because the second RF stage requires only small decoupling capacitance at its input (or possibly no decoupling capacitance) and so can absorb the difference between a capacitor stack voltage in the first stage and the input voltage, reducing loss in charging and discharging the capacitors.

Figure 14:
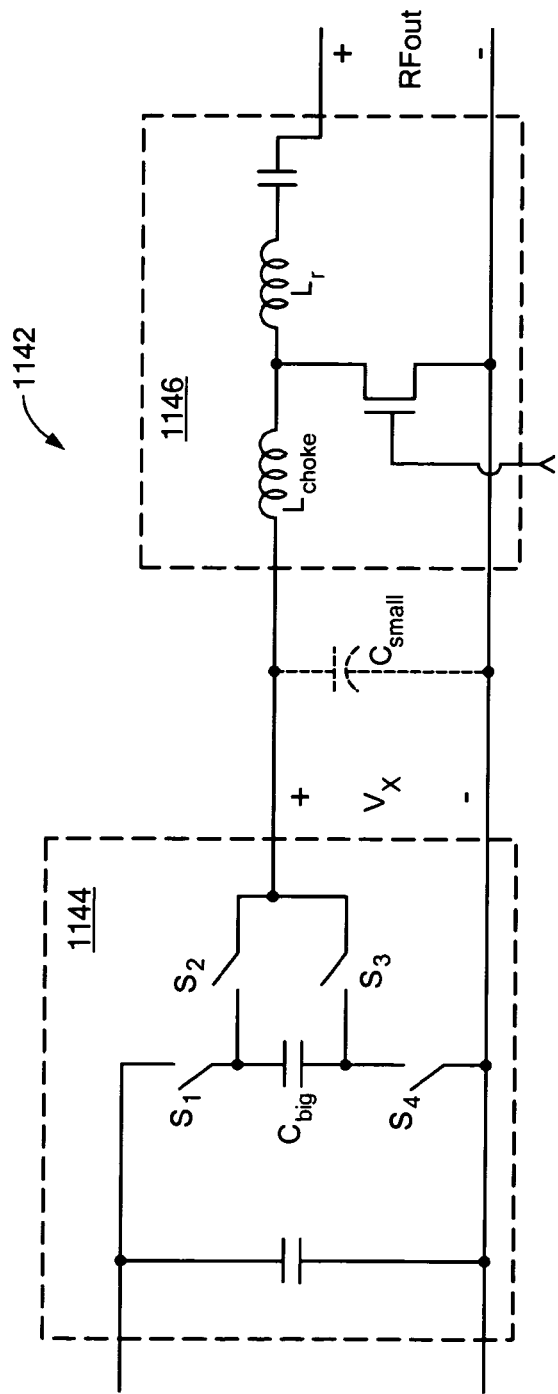
FIG. 14 is a block diagram of a circuit comprising a reconfigurable switched capacitor (SC) transformation stage coupled to a radio frequency (RF) power amplifier (PA) circuit.

Referring now to FIG. 14, a circuit 1142 includes a first stage 1144 corresponding to a reconfigurable switched capacitor converter (SC converter) which provides 1:1 and 2:1 voltage conversion ratios, coupled to a second stage 1146 corresponding to a power amplifier circuit. As illustrated in the design shown in FIG. 14, the coupling of the SC converter to the power amplifier circuit may be achieved by using an input capacitor $C_{small}$ at the input of the amplifier circuit (or second) stage. The capacitance value of capacitor $C_{small}$ is selected to be far smaller in value than the energy-transfer capacitors in the first stage. Alternatively, the coupling of the SC converter to the power amplifier circuit may be facilitated by eliminating any capacitance at the input of the second stage (i.e. at Vx)).

It should also be noted that it is explicitly recognized herein that one could construct the second stage to operate in switched mode (e.g., as a class E inverter), in linear mode (e.g., as a linear class B RF amplifier), as a set of outphased power amplifiers in switched or linear mode, or as any hybrid of these (e.g., a power amplifier operating sometimes in switched mode and sometimes in linear mode).

As described in US patent publication US 2009/0278520A1 of D. J. Perreault, R. C. N. Pilawa-Podgurski, and D. M. Giuliano, entitled "Power Converter with Capacitive Energy Transfer and Fast Dynamic Response," which is assigned to the assignee of the present invention, the first stage may be provided as a switched-capacitor converter providing multiple conversion ratios.

As will be discussed further in conjunction with FIG. 15 below, because energy needn't be delivered indefinitely at each voltage level, high performance can be achieved with simpler capacitor voltage modulator circuits than would be necessary if the circuit need deliver energy continuously at each voltage level (i.e., using switched-capacitor converter methods that can provide continuous operation at each conversion ratio).

Figure 15:
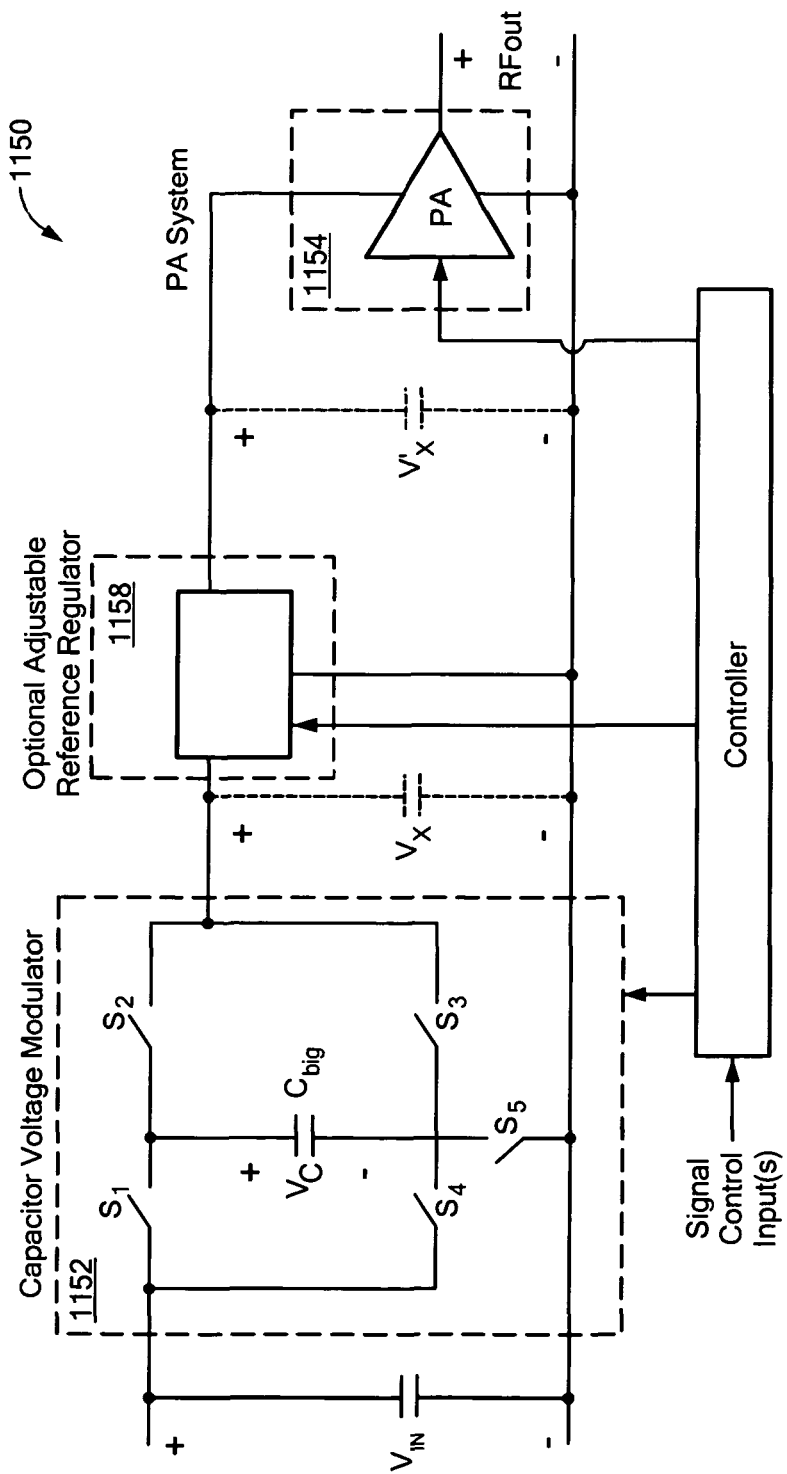
FIG. 15 is a block diagram of a circuit comprising a reconfigurable switched capacitor (SC) voltage modulator transformation stage coupled to a radio frequency (RF) power amplifier (PA) circuit.

Referring now to FIG. 15 a circuit 1150 comprises a first stage 1152 corresponding to a capacitor voltage modulator circuit coupled to a second stage 1154 corresponding to an RF power amplifier. A single power supply voltage $V_{IN}$ is coupled to an input of the capacitor voltage modulator circuit and the RF power amplifier PA is coupled (as the second stage) to the output of the capacitor voltage modulator circuit to develop an RF output.

This switched-mode capacitor voltage modulator circuit effectively provides one of four voltage levels to the second stage (and permits rapid dynamic switching among levels), yet only requires five switches and a single energy transfer capacitor $C_{big}$ (not considering any decoupling capacitance at the power supply input of the capacitor voltage modulator circuit or at the input to the second stage).

TABLE 2

| State | Switches On | Capacitor Voltage Modulator Output Voltage $V_x$ | Approximate Voltage Value (Vc ≈ 0.5 Vin) | Notes |
|---|---|---|---|---|
| A | S3, S4 | 0 | 0 | |
| B | S1, S3 | Vin − Vc | 0.5 Vin | Vc increases in this state |
| C | S2, S4 | Vc | 0.6 Vin | Vc decreases in this state |
| D | S1, S2 | Vin | Vin | |
| E | S2, S5 | Vin + Vc | 1.5 Vin | Vc decreases in this state |

Table 2 shows the switch states and resulting intermediate voltages provided by the capacitor voltage modulator circuit of FIG. 15. To understand operation of the capacitor voltage modulator circuit, consider the following: the circuit is controlled to maintain the capacitor voltage $V_c$ near $V_{in}/2$, while providing a voltage $V_x$ to the second stage that can be selected from one of (approximately) $1.5V_{in}$, $V_{in}$, $0.5V_{in}$ and 0. This is achieved by selecting appropriate switch states as indicated in Table 1. Voltages $V_x$ of 0 and $V_{in}$ can be maintained indefinitely (by selecting states D and A, respectively). A voltage $V_x$ close to 0.5 $V_{in}$ can be achieved by selecting one of two states (B and C). In one of these states (C) capacitor voltage decreases over time, while in the other (B) capacitor voltage increases over time. One can select from among these two states over time in order to maintain the capacitor close to the desired value of 0.5 Vin. This could be done, for example, on a clocked/timed basis—such as "symbol by symbol" for an RF transmission-selecting state B in a given timing period if $V_c$ is below 0.5 $V_{in}$ or some related threshold or state C if $V_c$ is above $V_{in}$ or some related threshold. Alternatively, it could be done on a hysteretic or asynchronous basis, maintaining $V_c$ within some set margin about 0.5 $V_{in}$). By selecting from among these two states appropriately over time, the voltage $V_x$ can be maintained near 0.5 $V_{in}$ indefinitely if desired. The voltage $V_x$ can be selected close to 1.5 $V_{in}$ using state E. In this state, the capacitor voltage $V_c$ discharges over time, and consequently this (largest) voltage level cannot be maintained indefinitely. The selected level $V_x$ must be switched down to 0.5 $V_{in}$ (using state B) a sufficient amount in between times that the selected level is set to 1.5 $V_{in}$ (using state E) in order to enable the capacitor to be recharged and its voltage maintained near 0.5 $V_{in}$. This capacitor voltage modulator circuit can thus indefinitely maintain voltages near a, $0.5V_{in}$ and $V_{in}$, and can provide a voltage near 1.5 $V_{in}$ for a limited duration.

Note that in some applications, it may be desirable to add a linear regulation stage (including one or more linear regulators) between the switched-capacitor voltage modulator and an amplifier stage (e.g. one of the power amplifier stages shown in FIGS. 13-15), such that the voltage provided to the power amplifier stage depends only upon the selected level, and not upon the charging or discharging of the energy transfer capacitor(s). This could be accomplished by having the linear regulator stage provide a drop that absorbs the difference between the (slightly varying) output of the switched-capacitor voltage modulator and a selected reference output voltage for each level. Such an added linear regulation stage, illustrated as linear regulation stage 1158 in FIG. 15, could reduce memory effects in the power amplifier system. Similar effects could also be realized (without the linear regulation stage) by feedforward of the voltage modulator output voltage to the controls for the power amplifier stage.

Figure 16:
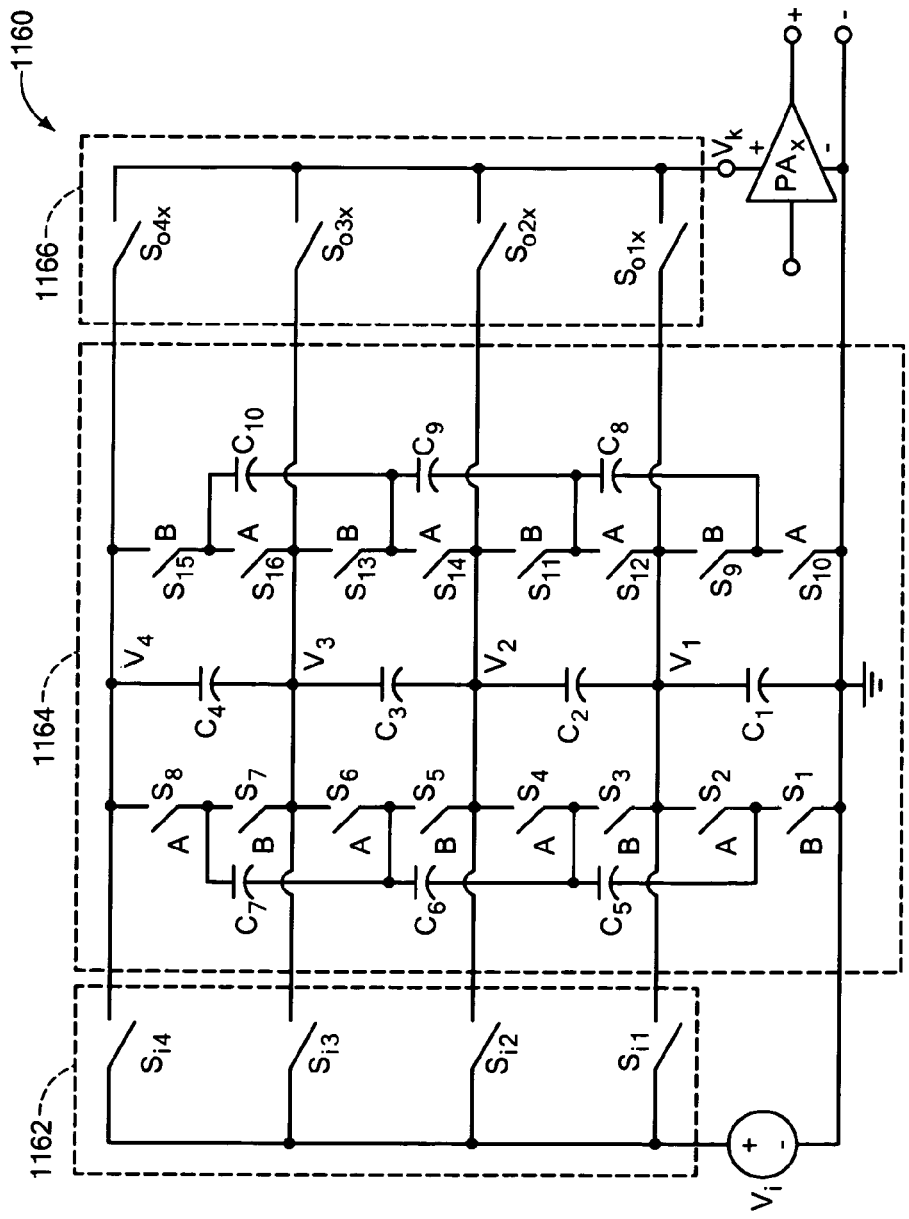
FIG. 16 is a block diagram of a circuit comprising a reconfigurable switched capacitor (SC) circuit coupled to an input source and to a load, and including an input configuration switch bank and an output configuration switch bank.

Referring now to FIG. 16, an exemplary reconfigurable switched-capacitor voltage modulator system 1160 couples an input signal from an input source $V_i$, to a second stage voltage Vx. In particular, an input voltage signal is coupled through an input configuration switch bank 1162 to a multilevel switched-capacitor circuit core 1164 and to an output through an output configuration switch bank 1166.

In the exemplary embodiment of FIG. 16, the multilevel switched-capacitor circuit core 1164 comprises a switched-capacitor ladder circuit, and in particular an interleaved switched-capacitor ladder circuit comprising sixteen switches $S_1$-$S_{16}$ and associated capacitors. Those of ordinary skill in the art will appreciate that in some embodiments it may be desirable to utilize a multilevel switched-capacitor circuit core having fewer or greater than sixteen switches and different numbers of capacitors, and that other topologies may also be used.

The reconfigurable switched-capacitor voltage modulator system 1160 is reconfigurable in two ways: (a) changing the configuration of the input bank for a given output switch settings restructures the set of conversion ratios from the input to the intermediate voltages; and (b) the output configuration network—for a given configuration of the input bank—restructures the conversion ratio from the input to the output. It should be noted that it is possible to eliminate one or the other of the input and output configuration switch banks 1162, 1166 (but not both) and have the system be reconfigurable.

In the exemplary embodiment of FIG. 16, input configuration switch bank 1162 comprises M input configuration switches (or input selector switches) generally denoted $S_{im}$ for the $m^{th}$ switch. In general input configuration switch bank 1162 comprises one or more input selector switches with four switches $S_{i1}$-$S_{i4}$ being shown in the exemplary embodiment of FIG. 16. It should, of course, be appreciated that after reading the disclosure provided herein, one of ordinary skill in the art will understand that any number of switches can be used in the input configuration switch bank and one of ordinary skill in the art will understand how to select the particular number of switches to use in input configuration switch bank 1162 to satisfy the requirements of a particular application (or more accurately perhaps, the number of input and output switch ports required in input configuration switch bank 1162 to satisfy the requirements of a particular application. Switch configurations other than that specifically shown in the exemplary embodiment of FIG. 16, may of course, also be used.

The multilevel switched-capacitor circuit core 1164 is coupled through an output configuration switch bank 1166 to a power amplifier $PA_X$. In the exemplary embodiment of FIG. 16, output configuration switch bank 1166 comprises N output configuration switches (or output selector switches) generally denoted $S_{on}$. In general output configuration switch bank 1164 comprises one or more output selector switches with four switches $S_{o1x}$-$S_{o4x}$ coupled between the reconfigurable switched-capacitor voltage circuit 1164 and power amplifier $PA_X$ in the exemplary embodiment of FIG. 6.

The reconfigurable switched-capacitor voltage circuit 1164 includes switches $S_1$-$S_{16}$ which may be operated to provide switched-capacitor voltage conversion yielding steady-state ratiometric relationships among voltages V1, V2, V3 and V4 such that $V_4/4=V_3/3=V_2/2=V_1/1$. Input selector switches $S_{i1}$-$S_{i4}$ and output selector switches $S_{o1x}$-$S_{o4x}$ enable a steady-state conversion ratio from input voltage $V_{in}$ to the voltage $v_x$ supplied to a power amplifier PAx to be dynamically reconfigured. Table 3 shows the steady-state voltages at the switched-capacitor voltage modulator output $v_x$ as a function of the selector switch configurations. With M Input selector switches (e.g. four input selector switches $S_{i1}$-$S_{i4}$ generally denoted $S_{im}$ in FIG. 16) and N output selector switches (e.g. four output selector switches $S_{o1}$-$S_{o4}$ generally denoted $S_{onx}$ for the $n^{th}$ switch in FIG. 16), selecting switches to turn on $S_{im}$ and $S_{onx}$ results in a steady state voltage $v_x=(n/m) \cdot V_{in}$.

The input and output selector switches may be employed as follows: The state of output selector switches $S_{o1x}$-$S_{o4x}$ may be changed to rapidly modulate a voltage provided at the power amplifier without the inducing significant variations in voltages $V_1$-$V_4$. This may be done, for example, to provide rapid discrete drain modulation of the power amplifier in response to rapid changes in desired output amplitude.

The state of input selector switches $S_{i1}$-$S_{i4}$ may be changed to reconfigure the set of voltages that may be provided at the power amplifier with respect to the input voltage $V_{in}$. Changing the state of input selector switches $S_{i1}$-$S_{i4}$ rescales the capacitor voltages and voltages $V_1$-$V_4$. Consequently, reconfiguration of operation through changing the input-side selector switches is well-suited for making long-time-scale adjustments in the available voltages. This may include, for example, adjusting the amplitude of the ratiometric set of voltages available at the output $v_x$ as compared to $V_{in}$ in order to accommodate long-time-scale adjustments in desired power amplifier output power, or reducing the magnitude of the variation in the set of available output voltages $v_x$ as the input voltage $V_{in}$ varies (e.g., owing to battery discharge). Thus, the output selector switches may provide rapid modulation of voltage $v_x$ among a set of available voltages $V_1$-$V_4$, while the input selector switches may provide discrete slow-time-scale adjustment of the set of voltages $V_1$-$V_4$.

Switched-capacitor energy transfer among the different levels is accomplished by modulating switches $S_1$-$S_{16}$ on and off. Even numbered switches (e.g. $S_2$, $S_4$, $S_6$, $S_8$, etc. . . . ) designated with reference letter "A" and odd numbered switches (e.g. $S_1$, $S_3$, $S_5$, $S_7$, etc. . . . ) designated with reference letter "B" may be alternately turned on and off ("A" and "B" devices in complementary states, neglecting switching deadtime), in keeping with techniques used in two-phase switched-capacitor power converters. Frequency control of such switching can be used to maintain high efficiency and desired conversion ratio in the face of load variations. Alternate switching of the "A" and "B" switches forms an interleaved system with continuous input and output currents, thereby minimizing the need for added filtering and decoupling. For some combinations of input and output selector switch activations, not all energy transfer capacitances $C_5$-$C_{10}$ are utilized, and so one may optionally cease gating individual switches during such combinations (saving gating loss) without adversely affecting circuit performance. The application of such reduced switching may be determined based on the instantaneous or time average values of configuration switch selections and/or on the basis of the values of circuit voltages (such as $V_1$-$V_4$ or across specific capacitors, for example).

Ideally, only capacitors $C_5$-$C_{10}$ are used/required for energy transfer, with capacitors $C_1$-$C_4$ only providing decoupling and holdup during switching deadtimes. Consequently, the size, capacitance and energy storage of capacitors $C_1$-$C_4$ may be preferably selected much smaller than those of energy transfer capacitors $C_5$-$C_{10}$. In some embodiments, energy storage of capacitors $C_1$-$C_4$ may be a factor of two or more smaller or even a factor of ten or more smaller than energy transfer capacitors $C_5$-$C_{10}$. The selection of particular capacitor sizes will vary based upon the needs of a particular application and those of ordinary skill I the art, after reading the description provided herein, will appreciate how to select capacitor sizes for a particular application. It should be noted that capacitors $C_1$-$C_4$ may, in principal at least, be omitted from the circuit entirely, though there is benefit to having some capacitance present for decoupling and waveform smoothing. A benefit of providing capacitors $C_1$-$C_4$ having a capacitance which is relatively small compared with the capacitance of capacitors $C_5$-$C_{10}$, is that the load provided by power amplifier $PA_X$ may be used to soft charge and discharge (or "adiabatically" charge and discharge) the energy transfer capacitors $C_5$-$C_{10}$ in whole or in part. This can provide a combination of smaller size, higher efficiency and lower frequency for the converter than would otherwise be achievable.

It will be recognized that while the exemplary embodiment of FIG. 16 includes four intermediate levels, the structure is modular, and versions of the circuit with greater than or fewer than four intermediate levels can be readily realized, as determined by the needs of a particular system. Also, while FIG. 16 shows an advantageous highly-flexible implementation having both input and output selector switches, one may remove one or the other of input and output selector switches (replacing this bank with a fixed connection) and still provide reconfigurable operation. After reading the disclosure provided herein, those of ordinary skill it the art will appreciate the factors to consider in selecting the number of intermediate levels to be used in a particular application. Also, while direct connection of the switched capacitor subsystem to the power amplifier and input source is shown, one may have additional filtering and/or power conversion at either or both interfaces (e.g., including filters, linear regulators, and switching power converters).

Switch configurations other than that specifically shown in the exemplary embodiment of FIG. 16, may of course, also be used. One of ordinary skill in the art, after reading the disclosure provided herein, will appreciate that any number of switches can be used and will also appreciate how to select the number of switches to include in the input and output configuration switch banks for a particular application (or more accurately perhaps, the number of input and output switch ports required in input configuration switch bank 1162 and output configuration switch bank 1166 for a particular application).

As will become apparent from the description provided herein below, the system described herein may include comprising as many additional sets of output selector switches as needed (i.e. as many input and output switch ports required in output configuration switch bank 1166 as needed) to provide system and circuit designs supporting multiple power amplifier paths.

Systems configured to support (i.e. configured to supply bias signals to) multiple PA's are valuable for implementing multi-PA architectures (e.g., Asymmetric Multilevel Outphasing, Asymmetric Multilevel Backoff, Doherty, Chireix, MLINC, etc.)

As will also become apparent from the descriptions provided hereinbelow, in alternative embodiments, it is possible to have PA loads with different/fewer selections of power supply levels, or even with direct supply of a PA with no output selector switches for that PA. Likewise, by providing input configuration switch bank having additional input and/or output ports (e.g. by additional set(s) of input configuration switches), it is possible to realize a higher degree of reconfigurability thereby enabling the system to be supplied from additional input source(s). In preferred embodiments, at least some of the additional input source(s) may have voltages, for example, which are different than voltages of other ones of the input source(s).

It will also be recognized that while the exemplary embodiment illustrated in FIG. 16 supports one PA from one input source, as described below in conjunction with FIGS. 17 and 18, the concepts, techniques and approaches described herein can readily be utilized to provide systems comprising a plurality of PAs and/or a plurality of power supply input sources.

Figure 17:
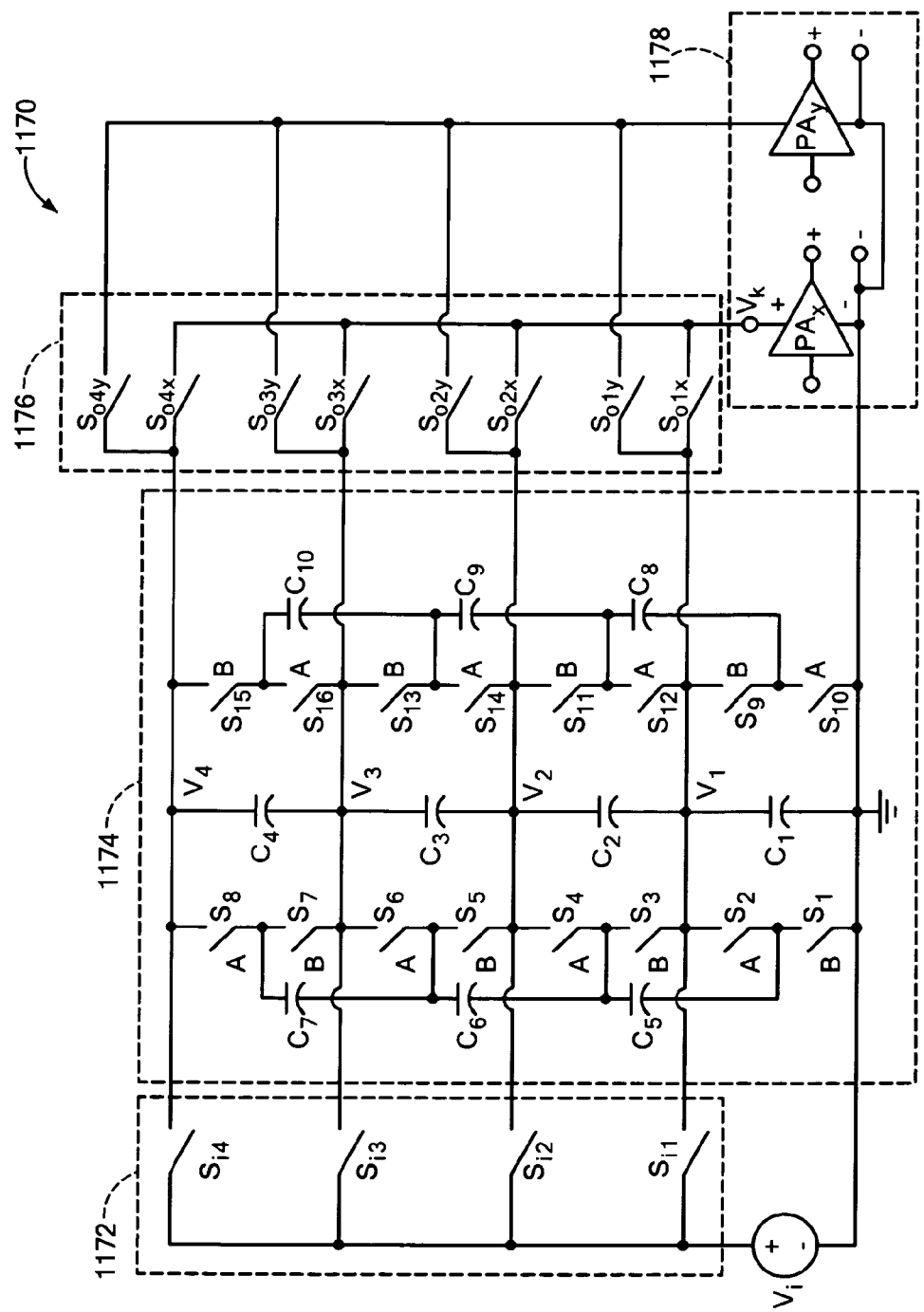
FIG. 17 a block diagram of a circuit comprising a reconfigurable switched capacitor (SC) circuit coupled to an input source and coupled to a plurality of loads, and including an input configuration switch bank and an output configuration switch bank.

Referring now to FIG. 17, an exemplary reconfigurable switched-capacitor voltage modulator system 1170 includes an input source $V_i$, coupled through input configuration switch bank 1172 to a multilevel switched-capacitor circuit core 1174 and through a set of output configuration switch banks 1176 to a load 1178.

In the exemplary embodiment of FIG. 17, input configuration switch bank 1172 which comprises one or more input configuration switches, here four switches $S_{i1}$-$S_{i4}$ being shown. It should, of course, be appreciated that after reading the disclosure provided herein, one of ordinary skill in the art will understand that any number of switches can be used in the input configuration switch bank and one of ordinary skill in the art will understand how to select the particular number of switches to use in input configuration switch bank 1172 to satisfy the requirements of a particular application (or more accurately perhaps, the number of input and output switch ports required in input configuration switch bank 1172 to satisfy the requirements of a particular application. Switch configurations other than that specifically shown in the exemplary embodiment of FIG. 17, may of course, also be used.

Ones of the intermediate voltages in multilevel switched-capacitor circuit core 1174 are coupled through an output configuration switch bank 1176 to a plurality of power amplifiers with two power amplifiers $PA_X$, $PA_Y$ being shown in the exemplary embodiment of FIG. 17. In the exemplary embodiment of FIG. 17, output configuration switch bank 1176 comprises a plurality of output configuration switches, here eight switches being shown, with four switches $S_{o1x}$-$S_{o4x}$ coupled between the multilevel switched-capacitor voltage modulator core 1174 and power amplifier $PA_X$ and four switches $S_{o1y}$-$S_{o4y}$ coupled between the multilevel switched-capacitor voltage modulator core 1174 and power amplifier $PA_Y$.

Switch configurations other than that specifically shown in the exemplary embodiment of FIG. 17, may of course, also be used. One of ordinary skill in the art, after reading the disclosure provided herein, will appreciate that any number of switches can be used and will also appreciate how to select the number of switches to include in the output configuration switch bank for a particular application (or more accurately perhaps, the number of input and output switch ports required in output configuration switch bank 1176 for a particular application).

From the above, it is clear that systems comprising as many additional sets of output selector switches as needed (i.e. as many input and output switch ports required in output configuration switch bank 1176 as needed) to provide system and circuit designs supporting multiple power amplifier paths.

Systems configured to support (i.e. configured to supply bias signals to) multiple PA's are valuable for implementing multi-PA architectures (e.g., Asymmetric Multilevel Outphasing, Asymmetric Multilevel Backoff, etc.)

In alternative embodiments, is possible to have PA loads with different/fewer selections of power supply levels, or even with direct supply of a PA with no output selector switches for that PA. Likewise, by providing input configuration switch bank having additional input and/or output ports (e.g. by additional set(s) of input configuration switches), it is possible to realize a higher degree of reconfigurability thereby enabling the system to be supplied from additional input source(s). In preferred embodiments, at least some of the additional input source(s) may have voltages, for example, which are different than voltages of other ones of the input source(s).

Figure 18:
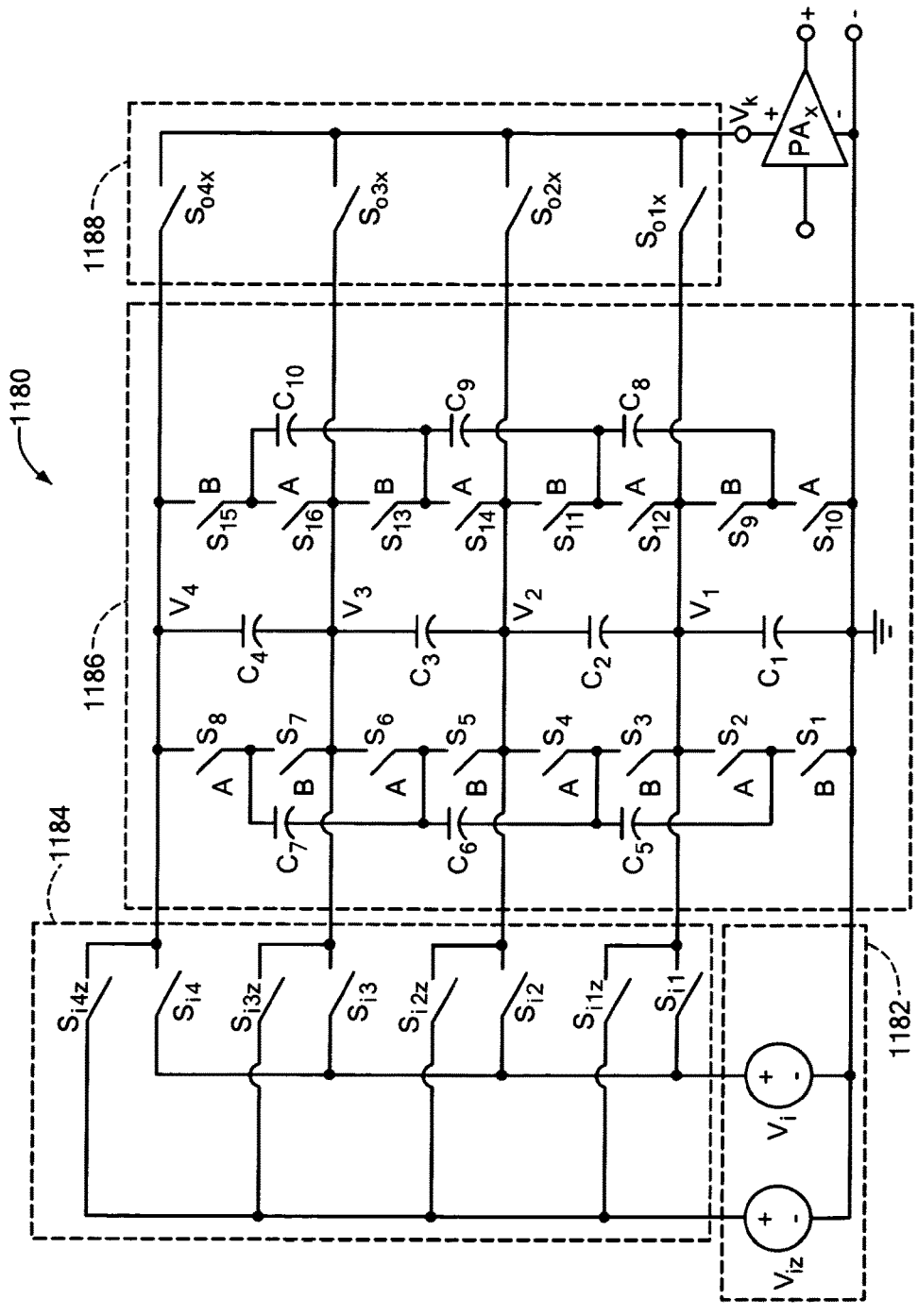
FIG. 18 is a reconfigurable switched capacitor (SC) circuit coupled to a plurality of input sources and coupled to a load, and including an input configuration switch bank and an output configuration switch bank.

Referring now to FIG. 18, a system 1180 with an input configuration switch bank which includes an additional set of input configuration switches (i.e. switches $S_{i1Z}$-$S_{i4Z}$ and an additional input source $V_{IZ}$). Systems with both additional input sources and additional PAs could be likewise realized.

TABLE 3

| Switches On | So1x | So2x | So3x | So4x |
|---|---|---|---|---|
| Si4 | (1/4) · $V_{in}$ | (2/4) · $V_{in}$ | (3/4) · $V_{in}$ | (4/4) · $V_{in}$ |
| Si3 | (1/3) · $V_{in}$ | (2/3) · $V_{in}$ | (3/3) · $V_{in}$ | (4/3) · $V_{in}$ |
| Si2 | (1/2) · $V_{in}$ | (2/2) · $V_{in}$ | (3/2) · $V_{in}$ | (4/2) · $V_{in}$ |
| Si1 | (1/1) · $V_{in}$ | (2/1) · $V_{in}$ | (3/1) · $V_{in}$ | (4/1) · $V_{in}$ |

Having described preferred embodiments of the concepts, systems, circuits and techniques described herein, it will now become apparent to those of ordinary skill in the art that other embodiments incorporating these concepts may be used. Accordingly, it is submitted that that the concepts, systems, circuits and techniques described herein, should not be limited to the described embodiments but rather should be limited only by the spirit and scope of the appended claims.

The invention claimed is:

1. A circuit for providing dc-to-rf conversion comprising:
    a first power conversion stage adapted to receive an input voltage and in response thereto to provide an output voltage at an output thereof; and
    a second power conversion stage adapted to receive a signal from said first power conversion stage and deliver power to an output, wherein:
    said first power conversion stage comprises a reconfigurable switched capacitor (SC) voltage modulator configured to provide a plurality of voltage conversion ratios from its input to its output and said reconfigurable switched capacitor (SC) voltage modulator having a pair of input terminals adapted to be coupled to an input voltage source and a pair of output terminals adapted to be coupled to input terminals of said second power conversion stage, the reconfigurable switched capacitor voltage modulator comprising a plurality of switches operable to provide four or more steady-state voltage conversion ratios from the input to the output, wherein said plurality of switches are operable to enable the steady-state voltage conversion ratios to be dynamically reconfigured; and
    said second power conversion stage comprises at least one of: an RF amplifier; or a power supply input of an RF amplifier,
    wherein said reconfigurable switched-capacitor voltage modulator comprises a first set of capacitors and a second set of capacitors corresponding to energy transfer capacitors and where said first set of capacitors are provided having a capacitance which is relatively small compared with the capacitance of the second set of capacitors such that a load may be used to soft charge and discharge said energy transfer capacitors in whole or in part.

2. The circuit of claim 1 wherein said first power conversion stage comprises a multilevel switched-capacitor circuit coupled to said second stage through an output configuration switch bank.

3. The circuit of claim 1 wherein said first power conversion stage comprises a multilevel switched-capacitor circuit configured to be coupled to at least one input source through an input configuration switch bank.

4. The circuit of claim 1 wherein the one or more switches dynamically control a conversion ratio of the first power conversion stage such that an intermediate voltage can be modulated as a function of any of: (a) an input voltage; (b) a reference voltage; or (c) an rf output amplitude.

5. A switched-mode capacitor voltage modulator circuit comprising:
    a first stage comprising an energy transfer capacitor and a switch network having at least five switches, said switch network coupled about said single energy transfer capacitor such that said first stage effectively provides one of at least four voltage levels at an output thereof and permits rapid dynamic switching among levels;
    a second stage having one or more controls and an input coupled to the output of said first stage such that said second stage is adapted to receive each of the four voltage levels; and
    a feedforward signal coupled between the first stage, the second stage, and a controller, the feedforward signal configured to feedforward a voltage modulator output voltage to the controller, the controller configured to adjust the one or more controls of the second stage to thereby reduce variations in the output of the second stage,
    wherein said energy transfer capacitor is provided having a capacitance which is relatively small such that a load may be used to soft charge and discharge said energy transfer capacitor in whole or in part.

6. The circuit of claim 5, wherein the controller is configured to adjust the one or more controls of the second stage, based upon the feedforward signal, to reduce memory effects in the switched-mode capacitor voltage modulator.

7. A system for coupling at least one input source to at least one load, the system comprising:
an input configuration switch bank having one or more input ports and one or more output ports, and a plurality of input configuration switches, each of the switches having an input configured to selectively couple to at least one of the at least one input source;
a multilevel switched-capacitor voltage circuit providing a plurality of voltage levels having steady-state ratiometric relationships, at least one of said voltage levels coupled to at least some of the one or more output ports of said input configuration switch bank; and
an output configuration switch bank having two or more input ports and one or more output ports, with each of the two or more input ports coupled to said voltage levels of said multilevel switched-capacitor voltage circuit and each of the one or more output ports configured to be selectively coupled to at least one of the at least one load,
wherein said multilevel switched-capacitor voltage circuit comprises a first set of capacitors and a second set of capacitors corresponding to energy transfer capacitors and where said first set of capacitors are provided having a capacitance which is relatively small compared with the capacitance of the second set of capacitors such that a load may be used to soft charge and discharge said energy transfer capacitors in whole or in part.

8. The system of claim 7 wherein said input configuration switch bank comprises a first set of input configuration switches to provide the input and/or output ports.

9. The system of claim 7 wherein said output configuration switch bank comprises a plurality of output configuration switches.

10. The system of claim 7 wherein said output configuration switch bank comprises a first plurality of switches configured to be selectively coupled to a first one of the at least one load and a second plurality of switches configured to be selectively coupled to a second, different one of the at least one load.

11. The system of claim 7 wherein said system is provided as an Asymmetric Multilevel Backoff (AMBO) system.

12. The system of claim 7 wherein:
said multilevel switched-capacitor voltage circuit comprises a plurality of switches operable to provide switched-capacitor voltage conversion yielding four or more steady-state ratiometric relationships among a plurality of voltages $V_1$-$V_4$; and
said input configuration switch bank comprises a first set of input selector switches and said output configuration switch bank comprises a first set of output selector switches wherein said input selector switches and said output selector switches are operable to enable a steady-state conversion ratio from input voltage $V_{in}$ to a voltage $v_x$ supplied to an amplifier to be dynamically reconfigured.

13. The system of claim 12 wherein said system comprises M input selector switches $S_{im}$ and N output selector switches $S_{onx}$, where M and N are positive integers, and wherein steady-state voltages at the switched-capacitor voltage circuit output $v_x$ are selected as a function of configurations of the M input selector switches and the N output selector switches and wherein placing certain ones of input and output selector switches $S_{im}$ and $S_{onx}$ in their ON state results a steady state voltage $v_x$=(N/M) $V_{in}$.

14. The system of claim 12 wherein a state of output selector switches $S_{o1x}$-$S_{o4x}$ may be changed to rapidly modulate a voltage provided by the multilevel switched-capacitor voltage circuit to a power amplifier without the inducing significant variations in voltages $V_1$-$V_4$ such that rapid discrete drain modulation of the power amplifier is provided in response to rapid changes in a desired output amplitude.

15. The system of claim 12 wherein said input selector switches $S_{i1}$-$S_{i4}$ are configured such that changing a state of input selector switches $S_{i1}$-$S_{i4}$ rescales capacitor voltages to thereby reconfigure a set of voltages provided at the power amplifier with respect to the input voltage $V_{in}$.

16. The system of claim 12 wherein said output selector switches provide rapid modulation of an output voltage $v_x$ of said reconfigurable switched-capacitor voltage circuit among a set of available voltages $V_1$-$V_4$, while said input selector switches provide discrete slow-time-scale adjustment of the set of voltages $V_1$-$V_4$.

17. The system of claim 12 wherein an energy transfer among different levels is accomplished by modulating switches in said multilevel switched-capacitor voltage circuit on and off and wherein a first set of switches in said reconfigurable switched-capacitor voltage circuit are alternately turned on and off in complementary states with a second set of switches in said multilevel switched-capacitor voltage circuit such that an interleaved system with continuous input and output currents is provided thereby reducing a need for added filtering and decoupling.

18. A system for coupling at least one input source to at least one radio frequency (RF) load, the system comprising:
an input configuration switch bank having one or more input ports, one or more output ports, and a set of input selector switches;
a multilevel switched-capacitor voltage circuit providing a plurality of voltage levels having steady-state ratiometric relationships, at least one of said voltage levels coupled to at least some of the one or more output ports of said input configuration switch bank, the multilevel switched-capacitor voltage circuit comprising a plurality of switches operable to provide switched-capacitor voltage conversion yielding three or more steady-state ratiometric relationships among a plurality of voltages; and
an output configuration switch bank having two or more input ports, one or more output ports and a set of output selector switches, with each of the two or more input ports coupled to said voltage levels of said multilevel switched-capacitor voltage circuit and each of the one or more output ports configured to be selectively coupled to at least one of the at least one load,
wherein said input selector switches and said output selector switches are operable to enable the steady-state ratiometric relationships to be dynamically reconfigured, and
wherein said multilevel switched-capacitor voltage circuit comprises a first set of capacitors and a second set of capacitors corresponding to energy transfer capacitors and where said first set of capacitors are provided having a capacitance which is relatively small compared with the capacitance of the second set of capacitors such that a load may be used to soft charge and discharge said energy transfer capacitors in whole or in part.

* * * * *